(12) United States Patent
Steele et al.

(10) Patent No.: US 8,667,363 B2
(45) Date of Patent: Mar. 4, 2014

(54) SYSTEMS AND METHODS FOR IMPLEMENTING CYCLIC REDUNDANCY CHECKS

(75) Inventors: Brian Steele, Denver, CO (US); George A. Wiley, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1399 days.

(21) Appl. No.: 11/285,391

(22) Filed: Nov. 23, 2005

(65) Prior Publication Data

US 2006/0168496 A1 Jul. 27, 2006

Related U.S. Application Data

(63) Continuation-in-part of application No. 11/107,536, filed on Apr. 14, 2005.

(60) Provisional application No. 60/630,853, filed on Nov. 24, 2004, provisional application No. 60/631,549, filed on Nov. 30, 2004, provisional application No. 60/632,825, filed on Dec. 2, 2004, provisional application No. 60/632,852, filed on Dec. 2, 2004, provisional application No. 60/633,071, filed on Dec. 2, 2004, provisional application No. 60/633,084, filed on Dec. 2, 2004.

(51) Int. Cl.
*H03M 13/00* (2006.01)

(52) U.S. Cl.
USPC .......................................... 714/758; 714/776

(58) Field of Classification Search
USPC ................................................ 714/758, 776
See application file for complete search history.

(56) References Cited

U.S. PATENT DOCUMENTS

| | | | |
|---|---|---|---|
| 3,594,304 A | 7/1971 | Chan |
| 4,042,783 A | 8/1977 | Gindi |

(Continued)

FOREIGN PATENT DOCUMENTS

| | | | |
|---|---|---|---|
| CN | 88101302 A | 10/1988 |
| CN | 1234709 A | 11/1999 |

(Continued)

OTHER PUBLICATIONS

Plug and Display Standard, Video Electronics Standards Association (VESA) San Jose, CA (Jun. 11, 1997).

(Continued)

*Primary Examiner* — M. Mujtaba K Chaudry
(74) *Attorney, Agent, or Firm* — Nicholas J. Pauley; Peter Michael Kamarchik; Joseph Agusta

(57) ABSTRACT

The present invention provides systems and methods for implementing cyclic redundancy checks to improve link initialization processing and to exchange system error information. In one aspect, a cyclic redundancy check (CRC) checker is provided that includes a unique pattern detector, a CRC generator, a CRC initializer and a CRC verifier. The CRC checker prepopulates the CRC generator for a unique pattern. Upon receipt of the unique pattern within a data stream received over a digital transmission link, the CRC checker proceeds to check CRCs without the need to queue and store data. In another aspect, a CRC generator system is provided that intentionally corrupts CRC values to transmit system error information. The CRC generator system includes a CRC generator, a CRC corrupter, an error detector and an error value generator. In one example, the digital transmission link is an MDDI link.

24 Claims, 18 Drawing Sheets

(56) References Cited

U.S. PATENT DOCUMENTS

| | | | |
|---|---|---|---|
| 4,363,123 A | 12/1982 | Grover | |
| 4,393,444 A | 7/1983 | Weinberg | |
| 4,491,943 A * | 1/1985 | Iga et al. | 370/511 |
| 4,660,096 A | 4/1987 | Arlan et al. | |
| 4,764,805 A | 8/1988 | Rabbani et al. | |
| 4,769,761 A | 9/1988 | Downes et al. | |
| 4,812,296 A | 3/1989 | Schmelz et al. | |
| 4,821,296 A | 4/1989 | Cordell | |
| 4,891,805 A | 1/1990 | Fallin | |
| 5,079,693 A | 1/1992 | Miller | |
| 5,111,455 A | 5/1992 | Negus | |
| 5,131,012 A | 7/1992 | Dravida | |
| 5,138,616 A | 8/1992 | Wagner, Jr. et al. | |
| 5,155,590 A | 10/1992 | Beyers, II et al. | |
| 5,167,035 A | 11/1992 | Mann et al. | |
| 5,224,213 A | 6/1993 | Dieffenderfer et al. | |
| 5,227,783 A | 7/1993 | Shaw et al. | |
| 5,231,636 A | 7/1993 | Rasmussen | |
| 5,331,642 A | 7/1994 | Valley et al. | |
| 5,345,542 A | 9/1994 | Wye | |
| 5,359,595 A | 10/1994 | Weddle et al. | |
| 5,377,188 A | 12/1994 | Seki | |
| 5,396,636 A | 3/1995 | Gallagher et al. | |
| 5,418,452 A | 5/1995 | Pyle | |
| 5,418,952 A | 5/1995 | Morley et al. | |
| 5,420,858 A | 5/1995 | Marshall et al. | |
| 5,422,894 A * | 6/1995 | Abe et al. | 714/755 |
| 5,430,486 A | 7/1995 | Fraser et al. | |
| 5,477,534 A | 12/1995 | Kusano | |
| 5,483,185 A | 1/1996 | Scriber et al. | |
| 5,490,247 A | 2/1996 | Tung et al. | |
| 5,502,499 A | 3/1996 | Birch et al. | |
| 5,510,832 A | 4/1996 | Garcia | |
| 5,513,185 A | 4/1996 | Schmidt | |
| 5,519,830 A | 5/1996 | Opoczynski | |
| 5,521,907 A | 5/1996 | Ennis, Jr. et al. | |
| 5,524,007 A | 6/1996 | White et al. | |
| 5,530,704 A | 6/1996 | Gibbons et al. | |
| 5,535,336 A | 7/1996 | Smith et al. | |
| 5,543,939 A | 8/1996 | Harvey et al. | |
| 5,546,121 A | 8/1996 | Gotanda et al. | |
| 5,550,489 A | 8/1996 | Raab | |
| 5,559,459 A | 9/1996 | Back et al. | |
| 5,559,952 A | 9/1996 | Fujimoto | |
| 5,560,022 A | 9/1996 | Dunstan et al. | |
| 5,565,957 A | 10/1996 | Goto | |
| 5,575,951 A | 11/1996 | Anderson | |
| 5,604,450 A | 2/1997 | Borkar et al. | |
| 5,619,650 A | 4/1997 | Bach et al. | |
| 5,621,664 A | 4/1997 | Phaal | |
| 5,646,947 A | 7/1997 | Cooper et al. | |
| 5,664,948 A | 9/1997 | Dimitriadis et al. | |
| 5,680,404 A | 10/1997 | Gray | |
| 5,726,990 A | 3/1998 | Shimada et al. | |
| 5,732,352 A | 3/1998 | Gutowski et al. | |
| 5,733,131 A | 3/1998 | Park | |
| 5,734,118 A | 3/1998 | Ashour et al. | |
| 5,751,445 A | 5/1998 | Masunaga | |
| 5,751,951 A | 5/1998 | Osborne et al. | |
| 5,777,999 A | 7/1998 | Hiraki et al. | |
| 5,790,551 A | 8/1998 | Chan | |
| 5,798,720 A | 8/1998 | Yano et al. | |
| 5,802,351 A | 9/1998 | Frampton | |
| 5,815,507 A | 9/1998 | Vinggaard et al. | |
| 5,816,921 A | 10/1998 | Hosokawa | |
| 5,818,255 A | 10/1998 | New et al. | |
| 5,822,603 A | 10/1998 | Hansen et al. | |
| 5,844,918 A * | 12/1998 | Kato | 714/751 |
| 5,847,752 A | 12/1998 | Sebestyen | |
| 5,862,160 A | 1/1999 | Irvin et al. | |
| 5,864,546 A | 1/1999 | Campanella | |
| 5,867,501 A | 2/1999 | Horst et al. | |
| 5,867,510 A | 2/1999 | Steele | |
| 5,881,262 A | 3/1999 | Abramson et al. | |
| 5,903,281 A | 5/1999 | Chen et al. | |
| 5,935,256 A | 8/1999 | Lesmeister | |
| 5,953,378 A | 9/1999 | Hotani et al. | |
| 5,958,006 A | 9/1999 | Eggleston et al. | |
| 5,963,557 A | 10/1999 | Eng | |
| 5,963,564 A | 10/1999 | Petersen et al. | |
| 5,963,979 A | 10/1999 | Inoue et al. | |
| 5,969,750 A | 10/1999 | Hsieh et al. | |
| 5,982,362 A | 11/1999 | Crater et al. | |
| 5,983,261 A | 11/1999 | Riddle | |
| 5,990,852 A | 11/1999 | Szamrej | |
| 5,990,902 A | 11/1999 | Park | |
| 5,995,512 A | 11/1999 | Pogue, Jr. | |
| 6,002,709 A | 12/1999 | Hendrickson | |
| 6,014,705 A | 1/2000 | Koenck et al. | |
| 6,047,380 A | 4/2000 | Nolan et al. | |
| 6,049,837 A | 4/2000 | Youngman | |
| 6,055,247 A | 4/2000 | Kubota et al. | |
| 6,064,649 A | 5/2000 | Johnston | |
| 6,078,361 A | 6/2000 | Reddy | |
| 6,081,513 A | 6/2000 | Roy | |
| 6,091,709 A | 7/2000 | Harrison et al. | |
| 6,092,231 A | 7/2000 | Sze | |
| 6,097,401 A | 8/2000 | Owen et al. | |
| 6,101,601 A | 8/2000 | Matthews et al. | |
| 6,118,791 A | 9/2000 | Fichou et al. | |
| 6,151,067 A | 11/2000 | Suemoto et al. | |
| 6,151,320 A | 11/2000 | Shim et al. | |
| 6,154,156 A | 11/2000 | Tagato | |
| 6,154,466 A | 11/2000 | Iwasaki et al. | |
| 6,185,601 B1 | 2/2001 | Wolff | |
| 6,192,230 B1 | 2/2001 | Van Bokhorst et al. | |
| 6,198,752 B1 | 3/2001 | Lee | |
| 6,199,169 B1 | 3/2001 | Voth et al. | |
| 6,222,677 B1 | 4/2001 | Budd et al. | |
| 6,236,647 B1 | 5/2001 | Amalfitano et al. | |
| 6,242,953 B1 | 6/2001 | Thomas | |
| 6,243,596 B1 | 6/2001 | Kikinis | |
| 6,243,761 B1 | 6/2001 | Mogul et al. | |
| 6,246,876 B1 | 6/2001 | Hontzeas | |
| 6,252,526 B1 | 6/2001 | Uyehara | |
| 6,252,888 B1 | 6/2001 | Fite, Jr. et al. | |
| 6,256,509 B1 | 7/2001 | Tanaka et al. | |
| 6,288,739 B1 | 9/2001 | Hales et al. | |
| 6,297,684 B1 | 10/2001 | Uyehara et al. | |
| 6,308,239 B1 | 10/2001 | Osakada et al. | |
| 6,335,696 B1 | 1/2002 | Aoyagi et al. | |
| 6,359,479 B1 | 3/2002 | Oprescu | |
| 6,363,439 B1 | 3/2002 | Battles et al. | |
| 6,393,008 B1 | 5/2002 | Cheng et al. | |
| 6,397,286 B1 | 5/2002 | Chatenever et al. | |
| 6,400,392 B1 | 6/2002 | Yamaguchi et al. | |
| 6,400,654 B1 | 6/2002 | Sawamura et al. | |
| 6,400,754 B2 | 6/2002 | Fleming et al. | |
| 6,421,735 B1 | 7/2002 | Jung et al. | |
| 6,429,867 B1 | 8/2002 | Deering | |
| 6,430,196 B1 | 8/2002 | Baroudi | |
| 6,430,606 B1 | 8/2002 | Haq | |
| 6,434,187 B1 | 8/2002 | Beard et al. | |
| 6,438,363 B1 | 8/2002 | Feder et al. | |
| 6,457,090 B1 | 9/2002 | Young | |
| 6,475,245 B2 | 11/2002 | Gersho et al. | |
| 6,477,186 B1 | 11/2002 | Nakura et al. | |
| 6,480,521 B1 | 11/2002 | Odenwalder et al. | |
| 6,483,825 B2 | 11/2002 | Seta | |
| 6,487,217 B1 | 11/2002 | Baroudi | |
| 6,493,357 B1 | 12/2002 | Fujisaki | |
| 6,493,713 B1 | 12/2002 | Kanno | |
| 6,493,824 B1 | 12/2002 | Novoa et al. | |
| 6,545,979 B1 | 4/2003 | Poulin | |
| 6,549,538 B1 | 4/2003 | Beck et al. | |
| 6,549,958 B1 | 4/2003 | Kuba | |
| 6,574,211 B2 | 6/2003 | Padovani et al. | |
| 6,583,809 B1 | 6/2003 | Fujiwara | |
| 6,594,304 B2 | 7/2003 | Chan | |
| 6,609,167 B1 | 8/2003 | Bastiani et al. | |
| 6,611,221 B1 | 8/2003 | Soundarapandian et al. | |
| 6,611,503 B1 | 8/2003 | Fitzgerald et al. | |
| 6,618,360 B1 | 9/2003 | Scoville et al. | |
| 6,621,809 B1 | 9/2003 | Lee et al. | |

(56) References Cited

U.S. PATENT DOCUMENTS

| | | |
|---|---|---|
| 6,621,851 B1 | 9/2003 | Agee et al. |
| 6,636,508 B1 | 10/2003 | Li et al. |
| 6,636,922 B1 | 10/2003 | Bastiani et al. |
| 6,662,322 B1 | 12/2003 | Abdelilah et al. |
| 6,690,201 B1 | 2/2004 | Simkins et al. |
| 6,714,233 B2 | 3/2004 | Chihara et al. |
| 6,715,088 B1 | 3/2004 | Togawa |
| 6,728,263 B2 | 4/2004 | Joy et al. |
| 6,738,344 B1 | 5/2004 | Bunton et al. |
| 6,745,364 B2 | 6/2004 | Bhatt et al. |
| 6,754,179 B1 | 6/2004 | Lin |
| 6,760,722 B1 | 7/2004 | Raghunandan |
| 6,760,772 B2 | 7/2004 | Zou et al. |
| 6,760,882 B1 | 7/2004 | Catreux et al. |
| 6,765,506 B1 | 7/2004 | Lu |
| 6,771,613 B1 | 8/2004 | O'toole et al. |
| 6,778,493 B1 | 8/2004 | Ishii |
| 6,782,039 B2 | 8/2004 | Alamouti et al. |
| 6,784,941 B1 | 8/2004 | Su et al. |
| 6,791,379 B1 | 9/2004 | Wakayama et al. |
| 6,797,891 B1 | 9/2004 | Blair et al. |
| 6,804,257 B1 | 10/2004 | Benayoun et al. |
| 6,810,084 B1 | 10/2004 | Jun et al. |
| 6,813,638 B1 | 11/2004 | Sevanto et al. |
| 6,816,929 B2 | 11/2004 | Ueda |
| 6,831,685 B1 | 12/2004 | Ueno et al. |
| 6,836,469 B1 * | 12/2004 | Wu .............................. 370/322 |
| 6,850,282 B1 | 2/2005 | Makino et al. |
| 6,865,240 B1 | 3/2005 | Kawataka |
| 6,865,609 B1 | 3/2005 | Gubbi et al. |
| 6,865,610 B2 | 3/2005 | Bolosky et al. |
| 6,867,668 B1 | 3/2005 | Dagostino et al. |
| 6,882,361 B1 | 4/2005 | Gaylord |
| 6,886,035 B2 | 4/2005 | Wolff |
| 6,892,071 B2 | 5/2005 | Park et al. |
| 6,894,994 B1 | 5/2005 | Grob et al. |
| 6,895,410 B2 | 5/2005 | Ridge |
| 6,897,891 B2 | 5/2005 | Itsukaichi |
| 6,906,762 B1 | 6/2005 | Witehira |
| 6,927,746 B2 | 8/2005 | Lee et al. |
| 6,944,136 B2 | 9/2005 | Kim et al. |
| 6,947,436 B2 | 9/2005 | Harris et al. |
| 6,950,428 B1 | 9/2005 | Horst et al. |
| 6,956,829 B2 | 10/2005 | Lee |
| 6,973,039 B2 | 12/2005 | Redi et al. |
| 6,973,062 B1 | 12/2005 | Han |
| 6,975,145 B1 | 12/2005 | Vadi et al. |
| 6,990,549 B2 | 1/2006 | Main et al. |
| 6,993,393 B2 | 1/2006 | Von Arx et al. |
| 6,999,432 B2 | 2/2006 | Zhang et al. |
| 7,003,796 B1 | 2/2006 | Humpleman |
| 7,010,607 B1 | 3/2006 | Bunton |
| 7,012,636 B2 | 3/2006 | Hatanaka |
| 7,015,838 B1 | 3/2006 | Groen et al. |
| 7,023,924 B1 | 4/2006 | Keller et al. |
| 7,030,796 B2 | 4/2006 | Shim et al. |
| 7,036,066 B2 | 4/2006 | Weibel et al. |
| 7,042,914 B2 | 5/2006 | Zerbe et al. |
| 7,047,475 B2 | 5/2006 | Sharma et al. |
| 7,051,218 B1 | 5/2006 | Gulick et al. |
| 7,062,264 B2 | 6/2006 | Ko et al. |
| 7,062,579 B2 | 6/2006 | Tateyama et al. |
| 7,068,666 B2 | 6/2006 | Foster et al. |
| 7,095,435 B1 | 8/2006 | Hartman et al. |
| 7,110,420 B2 | 9/2006 | Bashirullah et al. |
| 7,126,945 B2 | 10/2006 | Beach |
| 7,138,989 B2 | 11/2006 | Mendelson et al. |
| 7,143,177 B1 | 11/2006 | Johnson et al. |
| 7,143,207 B2 * | 11/2006 | Vogt .............................. 710/31 |
| 7,145,411 B1 | 12/2006 | Blair et al. |
| 7,151,940 B2 | 12/2006 | Diao |
| 7,158,536 B2 | 1/2007 | Ching et al. |
| 7,158,539 B2 | 1/2007 | Zhang et al. |
| 7,161,846 B2 | 1/2007 | Padaparambil |
| 7,165,112 B2 | 1/2007 | Battin et al. |
| 7,178,042 B2 | 2/2007 | Sakagami |
| 7,180,951 B2 | 2/2007 | Chan |
| 7,184,408 B2 | 2/2007 | Denton et al. |
| 7,187,738 B2 | 3/2007 | Naven et al. |
| 7,191,281 B2 | 3/2007 | Bajikar |
| 7,219,294 B2 * | 5/2007 | Vogt .............................. 714/758 |
| 7,231,402 B2 | 6/2007 | Dickens |
| 7,251,231 B2 | 7/2007 | Gubbi |
| 7,257,087 B2 | 8/2007 | Grovenburg |
| 7,260,087 B2 | 8/2007 | Bao et al. |
| 7,269,153 B1 | 9/2007 | Schultz et al. |
| 7,274,652 B1 | 9/2007 | Webster et al. |
| 7,278,069 B2 | 10/2007 | Abrosimov et al. |
| 7,284,181 B1 | 10/2007 | Venkatramani |
| 7,301,968 B2 | 11/2007 | Haran et al. |
| 7,310,535 B1 | 12/2007 | MacKenzie et al. |
| 7,315,265 B2 | 1/2008 | Wiley et al. |
| 7,315,520 B2 | 1/2008 | Xue et al. |
| 7,317,754 B1 | 1/2008 | Remy et al. |
| 7,327,735 B2 | 2/2008 | Robotham et al. |
| 7,336,139 B2 | 2/2008 | Blair et al. |
| 7,336,667 B2 | 2/2008 | Allen et al. |
| 7,340,548 B2 | 3/2008 | Love et al. |
| 7,349,973 B2 | 3/2008 | Saito et al. |
| 7,373,155 B2 | 5/2008 | Duan et al. |
| 7,383,350 B1 | 6/2008 | Moore et al. |
| 7,383,399 B2 | 6/2008 | Vogt et al. |
| 7,392,541 B2 | 6/2008 | Largman et al. |
| 7,403,487 B1 | 7/2008 | Foladare et al. |
| 7,403,511 B2 | 7/2008 | Liang et al. |
| 7,405,703 B2 | 7/2008 | Qi et al. |
| 7,412,642 B2 | 8/2008 | Cypher |
| 7,430,001 B2 | 9/2008 | Fujii |
| 7,447,953 B2 * | 11/2008 | Vogt .............................. 714/716 |
| 7,451,362 B2 | 11/2008 | Chen et al. |
| 7,487,917 B2 | 2/2009 | Kotlarsky et al. |
| 7,508,760 B2 | 3/2009 | Akiyama et al. |
| 7,515,705 B2 | 4/2009 | Segawa et al. |
| 7,526,323 B2 | 4/2009 | Kim et al. |
| 7,536,598 B2 | 5/2009 | Largman et al. |
| 7,543,326 B2 | 6/2009 | Moni |
| 7,557,633 B2 | 7/2009 | Yu |
| 7,574,113 B2 | 8/2009 | Nagahara et al. |
| 7,595,834 B2 | 9/2009 | Kawai et al. |
| 7,595,835 B2 | 9/2009 | Kosaka et al. |
| 7,634,607 B2 | 12/2009 | Honda |
| 7,643,823 B2 | 1/2010 | Shamoon et al. |
| 7,729,720 B2 | 6/2010 | Suh et al. |
| 7,800,600 B2 | 9/2010 | Komatsu et al. |
| 7,813,451 B2 | 10/2010 | Binder et al. |
| 7,831,127 B2 | 11/2010 | Wilkinson |
| 7,835,280 B2 | 11/2010 | Pang et al. |
| 7,844,296 B2 | 11/2010 | Yuki |
| 7,873,343 B2 | 1/2011 | Gollnick et al. |
| 7,876,821 B2 | 1/2011 | Li et al. |
| 7,877,439 B2 | 1/2011 | Gallou et al. |
| 7,912,503 B2 | 3/2011 | Chang et al. |
| 7,945,143 B2 | 5/2011 | Yahata et al. |
| 7,949,777 B2 | 5/2011 | Wallace et al. |
| 8,031,130 B2 | 10/2011 | Tamura |
| 8,077,634 B2 | 12/2011 | Maggenti et al. |
| 8,325,239 B2 | 12/2012 | Kaplan et al. |
| 2001/0005385 A1 | 6/2001 | Ichiguchi et al. |
| 2001/0012293 A1 | 8/2001 | Petersen et al. |
| 2001/0032295 A1 | 10/2001 | Tsai et al. |
| 2001/0047450 A1 | 11/2001 | Gillingham et al. |
| 2001/0047475 A1 | 11/2001 | Terasaki |
| 2001/0053174 A1 | 12/2001 | Fleming et al. |
| 2002/0011998 A1 | 1/2002 | Tamura |
| 2002/0045448 A1 | 4/2002 | Park et al. |
| 2002/0067787 A1 | 6/2002 | Naven et al. |
| 2002/0071395 A1 | 6/2002 | Redi et al. |
| 2002/0131379 A1 | 9/2002 | Lee et al. |
| 2002/0140845 A1 | 10/2002 | Yoshida et al. |
| 2002/0146024 A1 | 10/2002 | Harris et al. |
| 2002/0188907 A1 | 12/2002 | Kobayashi |
| 2002/0193133 A1 | 12/2002 | Shibutani |
| 2003/0003943 A1 | 1/2003 | Bajikar et al. |
| 2003/0028647 A1 | 2/2003 | Grosu |

(56) References Cited

U.S. PATENT DOCUMENTS

| | | |
|---|---|---|
| 2003/0033417 A1 | 2/2003 | Zou et al. |
| 2003/0034955 A1 | 2/2003 | Gilder et al. |
| 2003/0035049 A1 | 2/2003 | Dickens et al. |
| 2003/0039212 A1 | 2/2003 | Lloyd et al. |
| 2003/0061431 A1 | 3/2003 | Mears et al. |
| 2003/0081557 A1 | 5/2003 | Mettala et al. |
| 2003/0086443 A1 | 5/2003 | Beach et al. |
| 2003/0091056 A1 | 5/2003 | Paul Hulme Walker et al. |
| 2003/0093607 A1 | 5/2003 | Main et al. |
| 2003/0125040 A1 | 7/2003 | Walton et al. |
| 2003/0144006 A1 | 7/2003 | Johansson et al. |
| 2003/0158979 A1 | 8/2003 | Tateyama et al. |
| 2003/0185220 A1 | 10/2003 | Valenci |
| 2003/0191809 A1 | 10/2003 | Mosley et al. |
| 2003/0194018 A1 | 10/2003 | Chang |
| 2003/0235209 A1 | 12/2003 | Garg et al. |
| 2004/0008631 A1 | 1/2004 | Kim |
| 2004/0024920 A1 | 2/2004 | Gulick et al. |
| 2004/0028415 A1 | 2/2004 | Eiselt |
| 2004/0049616 A1 | 3/2004 | Dunstan et al. |
| 2004/0073697 A1 | 4/2004 | Saito et al. |
| 2004/0082383 A1 | 4/2004 | Muncaster et al. |
| 2004/0100966 A1* | 5/2004 | Allen et al. ............... 370/395.1 |
| 2004/0128563 A1 | 7/2004 | Kaushik et al. |
| 2004/0130466 A1 | 7/2004 | Lu et al. |
| 2004/0140459 A1 | 7/2004 | Haigh et al. |
| 2004/0153952 A1 | 8/2004 | Sharma et al. |
| 2004/0176065 A1 | 9/2004 | Liu |
| 2004/0184450 A1 | 9/2004 | Omran |
| 2004/0199652 A1 | 10/2004 | Zou et al. |
| 2004/0221315 A1 | 11/2004 | Kobayashi |
| 2004/0260823 A1 | 12/2004 | Tiwari et al. |
| 2005/0012905 A1 | 1/2005 | Morinaga |
| 2005/0020279 A1 | 1/2005 | Markhovsky et al. |
| 2005/0021885 A1 | 1/2005 | Anderson et al. |
| 2005/0033586 A1 | 2/2005 | Savell |
| 2005/0055399 A1 | 3/2005 | Savchuk |
| 2005/0088939 A1 | 4/2005 | Hwang et al. |
| 2005/0091593 A1 | 4/2005 | Peltz |
| 2005/0108611 A1* | 5/2005 | Vogt ............................ 714/758 |
| 2005/0117601 A1 | 6/2005 | Anderson et al. |
| 2005/0120079 A1 | 6/2005 | Anderson et al. |
| 2005/0120208 A1 | 6/2005 | Dobson et al. |
| 2005/0125840 A1 | 6/2005 | Anderson et al. |
| 2005/0135390 A1 | 6/2005 | Anderson et al. |
| 2005/0138260 A1 | 6/2005 | Love et al. |
| 2005/0144225 A1 | 6/2005 | Anderson et al. |
| 2005/0154599 A1 | 7/2005 | Kopra et al. |
| 2005/0163085 A1 | 7/2005 | Cromer et al. |
| 2005/0163116 A1 | 7/2005 | Anderson et al. |
| 2005/0165970 A1 | 7/2005 | Ching et al. |
| 2005/0184993 A1 | 8/2005 | Ludwin et al. |
| 2005/0204057 A1 | 9/2005 | Anderson et al. |
| 2005/0213593 A1 | 9/2005 | Anderson et al. |
| 2005/0216421 A1 | 9/2005 | Barry et al. |
| 2005/0216599 A1 | 9/2005 | Anderson et al. |
| 2005/0216623 A1 | 9/2005 | Dietrich et al. |
| 2005/0248685 A1 | 11/2005 | Seo et al. |
| 2005/0259670 A1 | 11/2005 | Anderson et al. |
| 2005/0265333 A1 | 12/2005 | Coffey et al. |
| 2005/0271072 A1 | 12/2005 | Anderson et al. |
| 2005/0286466 A1 | 12/2005 | Tagg et al. |
| 2006/0004968 A1* | 1/2006 | Vogt ............................ 711/154 |
| 2006/0034301 A1 | 2/2006 | Anderson et al. |
| 2006/0034326 A1 | 2/2006 | Anderson et al. |
| 2006/0120433 A1 | 6/2006 | Baker et al. |
| 2006/0128399 A1 | 6/2006 | Duan et al. |
| 2006/0161691 A1 | 7/2006 | Katibian et al. |
| 2006/0164424 A1 | 7/2006 | Wiley et al. |
| 2006/0168496 A1 | 7/2006 | Steele et al. |
| 2006/0171414 A1 | 8/2006 | Katibian et al. |
| 2006/0179164 A1 | 8/2006 | Katibian et al. |
| 2006/0179384 A1 | 8/2006 | Wiley et al. |
| 2006/0212775 A1* | 9/2006 | Cypher ....................... 714/758 |
| 2006/0274031 A1 | 12/2006 | Yuen et al. |
| 2006/0288133 A1 | 12/2006 | Katibian et al. |
| 2007/0008897 A1 | 1/2007 | Denton et al. |
| 2007/0073949 A1 | 3/2007 | Fredrickson et al. |
| 2007/0098002 A1 | 5/2007 | Liu et al. |
| 2007/0274434 A1 | 11/2007 | Arkas et al. |
| 2008/0036631 A1 | 2/2008 | Musfeldt |
| 2008/0088492 A1 | 4/2008 | Wiley et al. |
| 2008/0129749 A1 | 6/2008 | Wiley et al. |
| 2008/0147951 A1 | 6/2008 | Love |
| 2008/0282296 A1 | 11/2008 | Kawai et al. |
| 2009/0055709 A1 | 2/2009 | Anderson et al. |
| 2009/0070479 A1 | 3/2009 | Anderson et al. |
| 2009/0290628 A1 | 11/2009 | Matsumoto |
| 2010/0128626 A1 | 5/2010 | Anderson et al. |
| 2010/0260055 A1 | 10/2010 | Anderson et al. |
| 2011/0013681 A1 | 1/2011 | Zou et al. |
| 2011/0022719 A1 | 1/2011 | Anderson et al. |
| 2011/0199383 A1 | 8/2011 | Anderson et al. |
| 2011/0199931 A1 | 8/2011 | Anderson et al. |
| 2012/0008642 A1 | 1/2012 | Katibian et al. |

FOREIGN PATENT DOCUMENTS

| | | |
|---|---|---|
| CN | 1310400 A | 8/2001 |
| CN | 1377194 A | 10/2002 |
| CN | 1467953 A | 1/2004 |
| CN | 1476268 A | 2/2004 |
| EP | 0594006 A1 | 4/1994 |
| EP | 0872085 | 12/1996 |
| EP | 0850522 A2 | 7/1998 |
| EP | 0896318 | 2/1999 |
| EP | 0969676 | 1/2000 |
| EP | 1217602 A2 | 6/2002 |
| EP | 1309151 | 5/2003 |
| EP | 1423778 A2 | 6/2004 |
| EP | 1478137 A1 | 11/2004 |
| EP | 1544743 A2 | 6/2005 |
| EP | 1580964 A1 | 9/2005 |
| EP | 1630784 | 3/2006 |
| FR | 2729528 A1 | 7/1996 |
| GB | 2250668 A | 6/1992 |
| GB | 2265796 A | 10/1993 |
| JP | 53131709 A | 11/1978 |
| JP | 62132433 A | 6/1987 |
| JP | 64008731 U | 1/1989 |
| JP | H01129371 A | 5/1989 |
| JP | 1314022 A | 12/1989 |
| JP | 4167715 A | 6/1992 |
| JP | 4241541 | 8/1992 |
| JP | 5199387 A | 8/1993 |
| JP | 5219141 A | 8/1993 |
| JP | 5260115 A | 10/1993 |
| JP | 6037848 A | 2/1994 |
| JP | 06053973 | 2/1994 |
| JP | 06317829 | 11/1994 |
| JP | 7115352 A | 5/1995 |
| JP | 08037490 | 2/1996 |
| JP | H0854481 A | 2/1996 |
| JP | 08-274799 | 10/1996 |
| JP | 09-006725 | 1/1997 |
| JP | H0923243 A | 1/1997 |
| JP | 09230837 A | 9/1997 |
| JP | 09261232 | 10/1997 |
| JP | 9270951 A | 10/1997 |
| JP | 9307457 A | 11/1997 |
| JP | 10200941 | 7/1998 |
| JP | 10234038 A | 9/1998 |
| JP | 10312370 A | 11/1998 |
| JP | 11017710 | 1/1999 |
| JP | 11032041 | 2/1999 |
| JP | 11122234 A | 4/1999 |
| JP | 11163690 A | 6/1999 |
| JP | 11225182 A | 8/1999 |
| JP | 11225372 A | 8/1999 |
| JP | 11249987 | 9/1999 |
| JP | 11282786 A | 10/1999 |
| JP | 11341363 A | 12/1999 |
| JP | 11355327 A | 12/1999 |
| JP | 2000188626 | 7/2000 |

(56) References Cited

FOREIGN PATENT DOCUMENTS

| | | | |
|---|---|---|---|
| JP | 2000216843 A | 8/2000 | |
| JP | 2000236260 | 8/2000 | |
| JP | 2000278141 A | 10/2000 | |
| JP | 2000295667 | 10/2000 | |
| JP | 2000324135 A | 11/2000 | |
| JP | 2000358033 A | 12/2000 | |
| JP | 200144960 | 2/2001 | |
| JP | 200194542 | 4/2001 | |
| JP | 2001094524 | 4/2001 | |
| JP | 2001177746 | 6/2001 | |
| JP | 2001222474 A | 8/2001 | |
| JP | 2001282714 A | 10/2001 | |
| JP | 2001292146 A | 10/2001 | |
| JP | 2001306428 | 11/2001 | |
| JP | 2001319745 A | 11/2001 | |
| JP | 2001320280 | 11/2001 | |
| JP | 2001333130 A | 11/2001 | |
| JP | 2002500855 A | 1/2002 | |
| JP | 2002503065 T | 1/2002 | |
| JP | 2002062990 A | 2/2002 | |
| JP | 2002208844 A | 7/2002 | |
| JP | 2002281007 A | 9/2002 | |
| JP | 2002300229 A | 10/2002 | |
| JP | 2002300299 A | 10/2002 | |
| JP | 2003006143 A | 1/2003 | |
| JP | 2003009035 A | 1/2003 | |
| JP | 2003044184 A | 2/2003 | |
| JP | 2003046595 | 2/2003 | |
| JP | 2003046596 A | 2/2003 | |
| JP | 2003058271 A | 2/2003 | |
| JP | 2003069544 A | 3/2003 | |
| JP | 2003076654 A | 3/2003 | |
| JP | 2003098583 A | 4/2003 | |
| JP | 2003111135 A | 4/2003 | |
| JP | 2003167680 | 6/2003 | |
| JP | 2003198550 A | 7/2003 | |
| JP | 2004005683 A | 1/2004 | |
| JP | 2004007356 A | 1/2004 | |
| JP | 2004021613 | 1/2004 | |
| JP | 2004046324 A | 2/2004 | |
| JP | 2004153620 | 5/2004 | |
| JP | 2004246023 A | 9/2004 | |
| JP | 2004297660 A | 10/2004 | |
| JP | 2004531916 W | 10/2004 | |
| JP | 20047309623 A | 11/2004 | |
| JP | 2004363687 A | 12/2004 | |
| JP | 2005107683 A | 4/2005 | |
| JP | 2005536167 A | 11/2005 | |
| JP | 2005539464 A | 12/2005 | |
| KR | 1020060056989 | 5/1999 | |
| KR | 199961245 | 9/1999 | |
| KR | 0222225 | 10/1999 | |
| KR | 1019990082741 | 11/1999 | |
| KR | 200039224 | 7/2000 | |
| KR | 1999-0058829 | 1/2001 | |
| KR | 100286080 | 1/2001 | |
| KR | 20010019734 | 3/2001 | |
| KR | 20020071226 | 9/2002 | |
| KR | 2003-0061001 | 7/2003 | |
| KR | 1020047003852 | 5/2004 | |
| KR | 2004-69360 | 8/2004 | |
| KR | 1020060053050 | 5/2006 | |
| KR | 2004-0014406 | 2/2007 | |
| RU | 2111619 | 5/1998 | |
| RU | 2150791 | 6/2000 | |
| RU | 2337497 | 10/2008 | |
| RU | 2337497 C2 | 10/2008 | |
| TW | 459184 B | 10/2001 | |
| TW | 466410 | 12/2001 | |
| TW | 488133 B | 5/2002 | |
| TW | 507195 | 10/2002 | |
| TW | 513636 | 12/2002 | |
| TW | 515154 | 12/2002 | |
| TW | 529253 | 4/2003 | |
| TW | 535372 | 6/2003 | |
| TW | 540238 B | 7/2003 | |
| TW | 542979 B | 7/2003 | |
| TW | 200302008 | 7/2003 | |
| TW | 546958 | 8/2003 | |
| TW | 552792 B | 9/2003 | |
| TW | 200304313 | 9/2003 | |
| TW | 563305 B | 11/2003 | |
| TW | 569547 B | 1/2004 | |
| TW | 595116 B | 6/2004 | |
| WO | 9210890 | 6/1992 | |
| WO | 9410779 | 5/1994 | |
| WO | WO9410779 A1 | 5/1994 | |
| WO | 9619053 | 6/1996 | |
| WO | 96/42158 A1 | 12/1996 | |
| WO | 98/02988 A2 | 1/1998 | |
| WO | WO9915979 | 4/1999 | |
| WO | 9923783 A2 | 5/1999 | |
| WO | 0130038 | 4/2001 | |
| WO | WO0137484 A2 | 5/2001 | |
| WO | WO0138970 A2 | 5/2001 | |
| WO | WO0138982 | 5/2001 | |
| WO | WO0158162 | 8/2001 | |
| WO | 0249314 A1 | 6/2002 | |
| WO | WO02098112 | 12/2002 | |
| WO | 03023587 A2 | 3/2003 | |
| WO | 03040893 | 5/2003 | |
| WO | WO03039081 A1 | 5/2003 | |
| WO | 03061240 | 7/2003 | |
| WO | WO2004015680 | 2/2004 | |
| WO | WO2004110021 A2 | 12/2004 | |
| WO | WO2005018191 A2 | 2/2005 | |
| WO | 2005073955 A1 | 8/2005 | |
| WO | 2005088939 | 9/2005 | |
| WO | 2005091593 | 9/2005 | |
| WO | 2005096594 | 10/2005 | |
| WO | 2005122509 | 12/2005 | |
| WO | WO2006008067 | 1/2006 | |
| WO | 2006058045 | 6/2006 | |
| WO | 2006058050 | 6/2006 | |
| WO | 2006058051 | 6/2006 | |
| WO | 2006058052 | 6/2006 | |
| WO | 2006058053 | 6/2006 | |
| WO | 2006058067 | 6/2006 | |
| WO | 2006058173 | 6/2006 | |
| WO | WO2007051186 | 5/2007 | |

OTHER PUBLICATIONS

Search Report, dated Nov. 8, 2006, for International Application No. PCT/US05/42415, 8 pages.
International Search Report PCT/US05/008073—International Search Authority—US May 25, 2005.
Internation Search Report PCT/US05/008832- International Search Authority—US Sep. 7, 2005.
International Search Report PCT/US05/009944—International Search Authority—US Sep. 7, 2005.
International Search Report PCT/US05/019530—International Search Authority—US Sep. 21, 2005.
Video Electronics Standards Association (VESA), "Mobile Displey Digital Interface Standard (MDDI)", Jul. 2004.
J. Sevanto, "Multimedia messaging service for GPRS and UMTS", IEEE on WCNC, Sep. 1999, pp. 1422-1426, vol. 3.
International Search Report, PCT/US2005/042643. International Searching Authority—United States Patent and Trademark Office, Oct. 5, 2006.
International Search Report, PCT/US2005/042402. International Searching Authority—United States Patent and Trademark Office, Feb. 20, 2007.
International Search Report, PCT/US2005/042414. International Searching Authority—United States Patent and Trademark Office, May 23, 2007.
International Search Report, PCT/US2005/042436. International Searching Authority—United States Patent and Trademark Office, Oct. 2, 2006.
"V4400," Product Brochure, May 31, 2004.
Liptak, "Instrument Engineer's Handbook, Third Edition, Volume Three: Process Software and Digital Networks, Section 4.17, Proprietary Networks, pp. 627-637, Boca Raton" CRC Press, Jun. 26, 2002.

(56) References Cited

OTHER PUBLICATIONS

VESA Mobile Display Digital Interface, Proposed Standard, Version 1 p. Draft 1 0, Aug. 13, 2003. pp. 76-151.
VESA Mobile Display Digital Interface, Proposed Standard, Version 1P, Draft 14, Oct. 29, 2003, pp. 76-158.
VESA Mobile Display Digital Interface, Proposed Standard: Version 1P, Draft 10, Aug. 13, 2003, pp. 1-75.
VESA Mobile Display Digital Interface, Proposed Standard: Version 1P, Draft 13, Oct. 15, 2003, pp. 76-154.
VESA Mobile Display Digital Interface, Proposed Standard: Version 1P, Draft 15, Nov. 12, 2003, pp. 1-75.
VESA Mobile Display Digital Interface, Proposed Standard: Version 1P, Draft 15, Nov. 12, 2003, pp. 76-160.
VESA Mobile Display Digital Interface, Proposed Standard; Version 1P, Draft 11, Sep. 10, 2003, pp. 1-75.
VESA Mobile Display Digital Interface. Proposed Standard, Version 1P, Draft 11, Sep. 10, 2003, pp. 76-150.
VESA Mobile Display Digital Interface; Proposed Standard, Version 1P, Draft 13, Oct. 15, 2003. pp. 1-75.
VESA Mobile Display Digital Interface, Proposed Standard: Version1P, Draft 14, Oct. 29, 2003, pp. 1-75.
International Search Report and Written Opinion—PCT/US05/042412, International Search Authority—European Patent Office—Jul. 8, 2008.
"Transmission and Multiplexing; High Bit Rate Digital Subscriber Line (HDSL) Transmission System on Metallic Local Lines; HDSL Core Specification and Applications for 2 048 Kbit/S Based Access Digital Sections; ETR 152" European Telecommunications Standard, Dec. 1996.
IEEE STD 1394B;IEEE Standard for High Performace Serial Bus-Amendment 2(Dec. 2002).
Written Opinion PCT/US05/042643, International Search Authority US, Oct. 5, 2006.
International search report and Written Opinion—PCT/US05/042413, International Search Authority—European Patent Office—Aug. 25, 2008.
International Search Report and Written Opinion—PCT/US05/042415, International Search Authority—European Patent Office—Nov. 8, 2006.
Written Opinion—PCT/US05/042436-International Search Authority—US Oct. 2, 2006.
European Search Report—EP05852048, Search Authority—The Hague Patent Office, Nov. 18, 2010.
European Search Report—EP10172872, Search Authority—Munich Patent Office, Dec. 17, 2010.
European Search Report—EP10172878, Search Authority—Munich Patent Office, Dec. 17, 2010.
European Search Report—EP10172882, Search Authority—Munich Patent Office, Dec. 29, 2010.
European Search Report—EP10172885, Search Authority—Munich Patent Office, Dec. 13, 2010.
Hopkins, K. et al.: "Display Power Management," IP.com Journal; IP.com Inc., West Henrietta, NY (Mar. 1, 1995), XP013103130, ISSN: 1533-0001, vol. 38 No. 3 pp. 425-427.
Masnick, B. et al.: "On Linear Unequal Error Protection Codes," IEEE Transactions on Information Theory, vol. IT-3, No. 4, (Oct. 1, 1967), pp. 600-607.
STMicroelectronics: "STV0974 Mobile Imaging DSP Rev.3", Datasheet internet, (Nov. 30, 2004), XP002619368. Retrieved from the Internet: URL: http://pdf1.alldatasheet.com/datasheet-pdf/view/112376/STMICROELECTRONICS/STV0974.html [retrieved on Jan. 27, 2011], pp. 1-69.
Supplementary European Search Report—EP05849651, Search Authority—The Hague Patent Office, Jan. 31, 2011.
Supplementary European Search Report—EP05852047, Search Authority—The Hague Patent Office, Jul. 6, 2010.
Taiwan Search Report—TW093127510—TIPO—Apr. 1, 2011.
Translation of Office Action in Chinese application 201010183254.3 corresponding to U.S. Appl. No. 11/008,024, dated Apr. 29, 2011.
"Universal Serial Bus Specification—Revision 2.0: Chapter 9—USB Device Framework," Universal Serial Bus Specification, Apr. 27, 2000, pp. 239-274, XP002474828.
VESA: "VESA Mobile Display Digital Interface Standard: Version 1." Milpitas, CA (Jul. 23, 2004), pp. 87-171.
3GPP C.S0047-0. "Link-Layer Assisted Service Options for Voice-over-IP: Header Remover (SO60) and Robust Header Compression (SO61)," Version 1.0, Apr. 14, 2003, pp. 1-36.
Taiwan Search Report—TW094141287—TIPO—May 5, 2012.
"Nokia 6255", Retrieved from the Internet: URL: http://nokiamuseum.com/view.php"model=6255 [retrieved on Feb. 4, 2012].
European Search Report—EP11155762—Search Authority—Hague—Feb. 13, 2012.
Taiwan Search Report—TW093134825—TIPO—Jan. 28, 2012.
Taiwan Search Report—TW093133101—TIPO—Feb. 2, 2012.
Taiwan Search Report—TW094141284 —TIPO—Aug. 21, 2012.

* cited by examiner

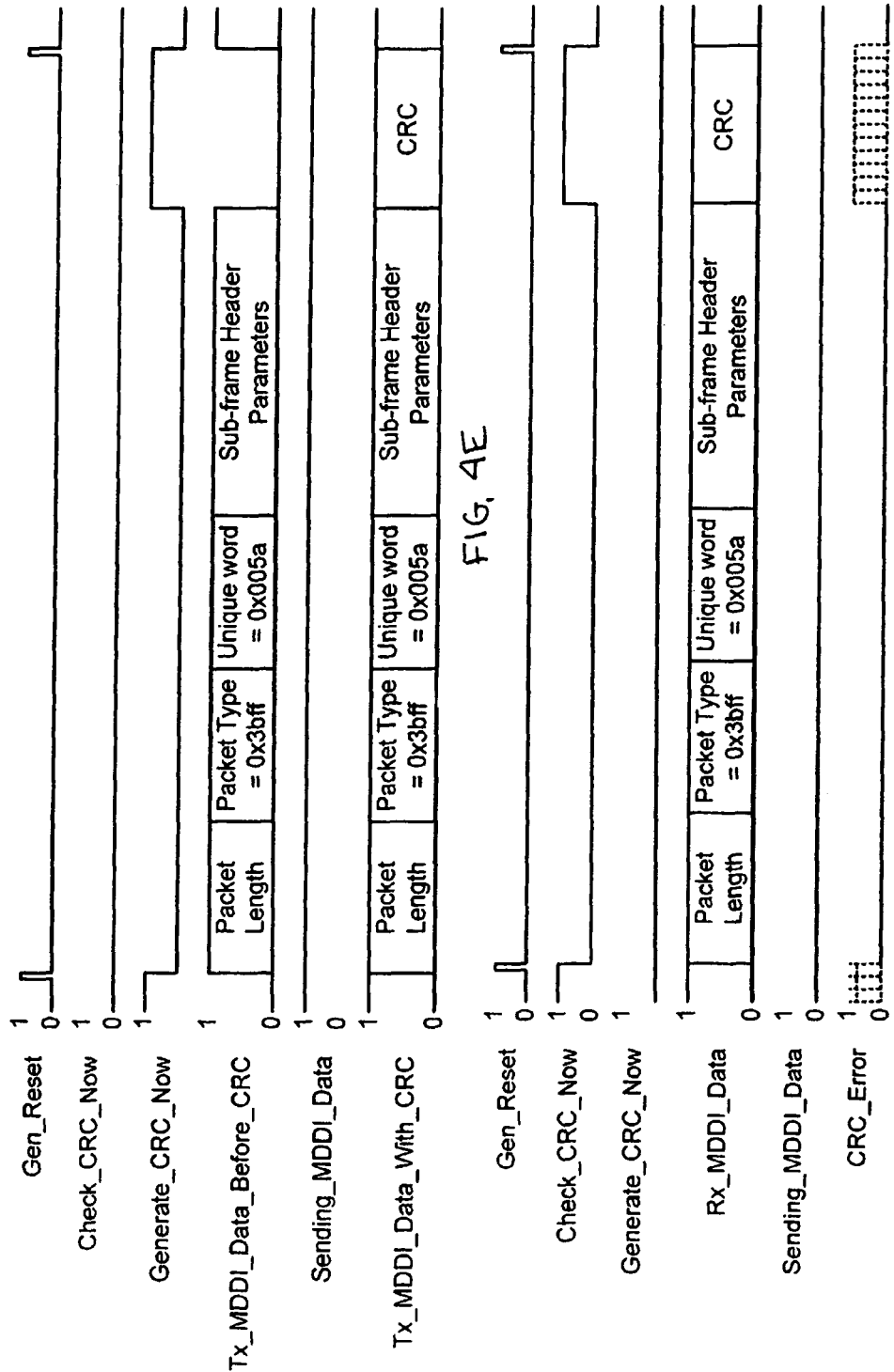

SYSTEMS AND METHODS FOR IMPLEMENTING CYCLIC REDUNDANCY CHECKS

CROSS REFERENCE TO RELATED APPLICATIONS

The present application is a continuation-in-part and claims priority under 35 U.S.C. 120 of U.S. patent application Ser. No. 11/107,536, entitled High Data Rate Interface Apparatus and Method, filed Apr. 14, 2005, which in turn claims priority under 35 U.S.C. 119 to U.S. Provisional Application No. 60/577,500, entitled Switchable Threshold Differential Interface, filed Jun. 4, 2004 and claims priority under 35 U.S.C. 120 to U.S. patent application Ser. No. 11/089,643, entitled High Data Rate Interface Apparatus and Method filed Mar. 24, 2005, which claims priority to U.S. Provisional Application No. 60/556,345, filed on Mar. 24, 2004. All of the above listed applications are hereby incorporated by reference.

The present application also claims priority under 35 U.S.C. 119 to U.S. Provisional Application No. 60/630,853, entitled MDDI Host Core Design, filed Nov. 24, 2004; U.S. Provisional Application No. 60/631,549, entitled Mobile Display Digital Interface Host Camera Interface Device, filed Nov. 30, 2004; U.S. Provisional Application No. 60/632,825, entitled Camera MDDI Host Device, filed Dec. 2, 2004; U.S. Provisional Application No. 60/632,852, entitled MDDI Host Core and Pathfinder, filed Dec. 2, 2004; U.S. Provisional Application No. 60/633,071, entitled MDDI Overview, filed Dec. 2, 2004; and U.S. Provisional Application No. 60/633,084, entitled MDDI Host Core Pad Design, all of which are hereby expressly incorporated by reference herein in their entireties.

The present application is also related to commonly assigned U.S. patent application Ser. No. 11/285,379, entitled Digital Data Interface Device, filed on Nov. 23, 2005 and to U.S. patent application Ser. No. 11/285,389, entitled Digital Data Interface Device Message Format, filed on Nov. 23, 2005, both of which are hereby expressly incorporated by reference herein in their entireties.

BACKGROUND OF THE INVENTION

1. Field of the Invention

The present invention relates generally to data communications. More particularly, the invention relates to digital transmission links using cyclic redundancy checks.

2. Background

Computers, mobile telephones, mobile telephone cameras and video capture devices, personal data assistants, electronic game related products and various video technologies (e.g., DVD's and high definition VCRs) have advanced significantly over the last few years to provide for capture and presentation of increasingly higher resolution still, video, video-on-demand, and graphics images. Combining such visual images with high quality audio data, such as CD type sound reproduction, DVDs, and other devices having associated audio signal outputs, creates a more realistic, content rich, or true multimedia experience for an end user. In addition, highly mobile, high quality sound systems and music transport mechanisms, such as MP3 players, have been developed for audio only presentations to users.

The explosion of high quality data presentation drove the need to establish specialized interfaces that could transfer data at high data rates, such that data quality was not degraded or impaired. One such interface is a Mobile Display Digital Interface (MDDI), used, for example, to exchange high speed data between the lower and upper clamshells of a cellular telephone that has a camera. MDDI is a cost-effective, low power consumption, transfer mechanism that enables very-high-speed data transfer over a short-range communication link between a host and a client. MDDI requires a minimum of just four wires plus power for bi-directional data transfer that with present technology can deliver a maximum bandwidth of up to 3.2 Gbits per second.

While MDDI and other data interfaces can be used to efficiently provide high speed data rates across interfaces, there are increasing needs to optimize performance and more effectively use digital transmission links, such as an MDDI link.

SUMMARY OF THE INVENTION

The present invention provides systems and methods for implementing cyclic redundancy checks (CRCs) to improve link initialization processing and to exchange system error information, such that digital transmission links can be used more effectively. In one aspect of the invention, a CRC checker is provided that includes a unique pattern detector, a CRC generator, a CRC initializer and a CRC verifier. The CRC checker prepopulates the CRC generator for a unique pattern. Because the CRC generator is prepopulated, upon receipt of the unique pattern within a data stream received over a digital transmission link, the CRC checker can proceed to check CRCs without the need to queue and store data.

In another aspect of the invention, a CRC generator system is provided that intentionally corrupts CRC values to transmit system or related system error information. The CRC generator system includes a CRC generator, a CRC corrupter, an error detector and an error value generator. The CRC generator generates a CRC value based on data to be included in a data packet to be transmitted over a digital transmission link. The CRC corrupter corrupts the CRC value generated by the CRC generator to convey host or related system status information. The error detector detects an error condition within a host or related system and provides instructions for the CRC corrupter to intentionally corrupt a CRC value.

In a further aspect of the invention, the CRC generator system can provide specific information as to the type of error that is included. In this case, in addition to the above elements, the CRC generator system includes an error value generator that instructs the CRC corrupter to replace a CRC value generated by the CRC generator with a specific CRC error value that indicates a type of system error or status condition.

In one example, the digital transmission link is an MDDI link. The present invention is not limited to MDDI links, and can be used with any type of digital transmission link in which CRCs are used.

Further embodiments, features, and advantages of the invention, as well as the structure and operation of the various embodiments of the invention are described in detail below with reference to the accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

FIG. 4E is a timing diagram showing the generation of a CRC.

FIG. 4F is a timing diagram showing the receipt of a CRC.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
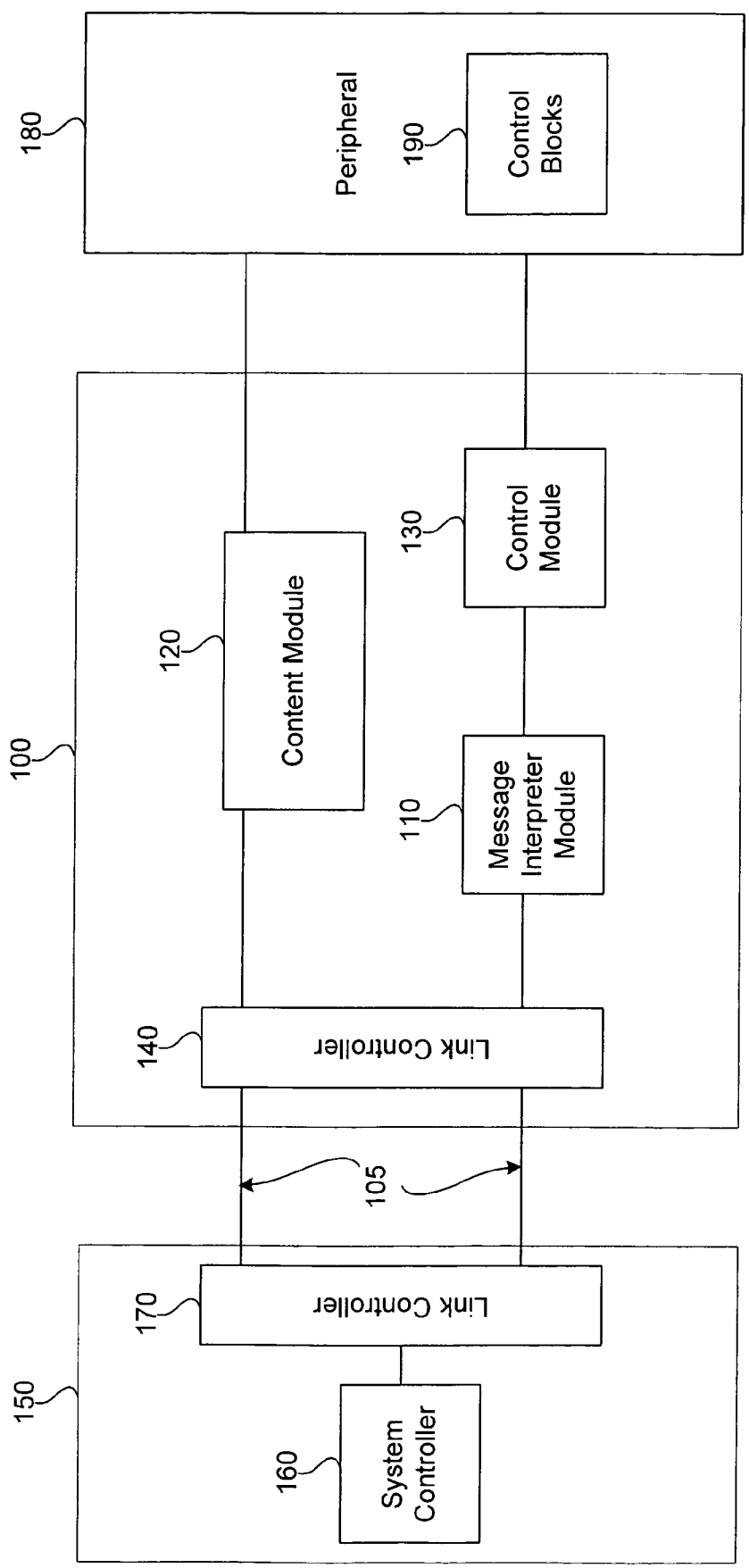
FIG. 1 is a diagram of a digital data device interface coupled to a digital device and a peripheral device.

FIG. 1 is a diagram of a digital data device interface 100 coupled to a digital device 150 and a peripheral device 180. Digital device 150 can include, but is not limited to, a cellular telephone, a personal data assistant, a smart phone or a personal computer. In general digital device 150 can include any type of digital device that serves as a processing unit for digital instructions and the processing of digital presentation data. Digital device 150 includes a system controller 160 and a link controller 170.

Peripheral device 180 can include, but is not limited to, a camera, a bar code reader, an image scanner, an audio device, and a sensor. In general peripheral 180 can include any type of audio, video or image capture and display device in which digital presentation data is exchanged between a peripheral and a processing unit. Peripheral 180 includes control blocks 190. When peripheral 180 is a camera, for example, control blocks 190 can include, but are not limited to lens control, flash or white LED control and shutter control. Digital presentation data can include digital data representing audio, image and multimedia data.

Digital data interface device 100 transfers digital presentation data at a high rate over a communication link 105. In one example, an MDDI communication link can be used which supports bi-directional data transfer with a maximum bandwidth of 3.2 Gbits per second. Other high rates of data transfer that are higher or lower than this example rate can be supported depending on the communications link. Digital data interface device 100 includes a message interpreter module 110, a content module 120, a control module 130 and a link controller 140.

Link controller 140, which is located within digital data interface 100, and link controller 170, which is located within digital device 150 establish communication link 105. Link controller 140 and link controller 170 may be MDDI link controllers.

The Video Electronics Standards Association ("VESA") MDDI Standard, which is incorporated herein by reference in its entirety, describes the requirements of a high-speed digital packet interface that lets portable devices transport digital images from small portable devices to larger external displays. MDDI applies a miniature connector system and thin flexible cable ideal for linking portable computing, communications and entertainment devices to emerging products such as wearable micro displays. It also includes information on how to simplify connections between host processors and a display device, in order to reduce the cost and increase the reliability of these connections. Link controllers 140 and 170 establish communication path 105 based on the VESA MDDI Standard.

U.S. Pat. No. 6,760,772, entitled Generating and Implementing a Communication Protocol and Interface for High Data Rate Signal Transfer, issued to Zou et al. on Jul. 6, 2004 ("'772 Patent") describes a data interface for transferring digital data between a host and a client over a communication path using packet structures linked together to form a communication protocol for presentation data. Embodiments of the invention taught in the '772 Patent are directed to an MDDI interface. The signal protocol is used by link controllers, such as link controllers 140 and 170, configured to generate, transmit, and receive packets forming the communications protocol, and to form digital data into one or more types of data packets, with at least one residing in the host device and being coupled to the client through a communications path, such as communications path 105.

The interface provides a cost-effective, low power, bi-directional, high-speed data transfer mechanism over a short-range "serial" type data link, which lends itself to implementation with miniature connectors and thin flexible cables. An embodiment of link controllers 140 and 170 establishes communication path 105 based on the teachings of the '772 Patent. The '772 Patent is herein incorporated by reference in its entirety.

In other embodiments, link controllers 140 and 170 can both be a USB link controller or they both can include a combination of controllers, such as for example, an MDDI link controller and another type of link controller, such as, for example, a USB link controller. Alternatively, link controllers 140 and 170 can include a combination of controllers, such as an MDDI link controller and a single link for exchanging acknowledgement messages between digital data interface device 100 and digital device 150. Link controllers 140 and 170 additionally can support other types of interfaces, such as an Ethernet or RS-232 serial port interface. Additional interfaces can be supported as will be known by individuals skilled in the relevant arts based on the teachings herein.

Within digital data interface device 100, message interpreter module 110 receives commands from and generates response messages through communication link 105 to system controller 160, interprets the command messages, and routes the information content of the commands to an appropriate module within digital data interface device 100.

Content module 120 receives data from peripheral device 180, stores the data and transfers the data to system controller 160 through communication link 105.

Control module 130 receives information from message interpreter 130, and routes information to control blocks 190 of peripheral device 180. Control module 130 can also receive information from control blocks 190 and routes the information to the message interpreter module 110.

Figure 2:
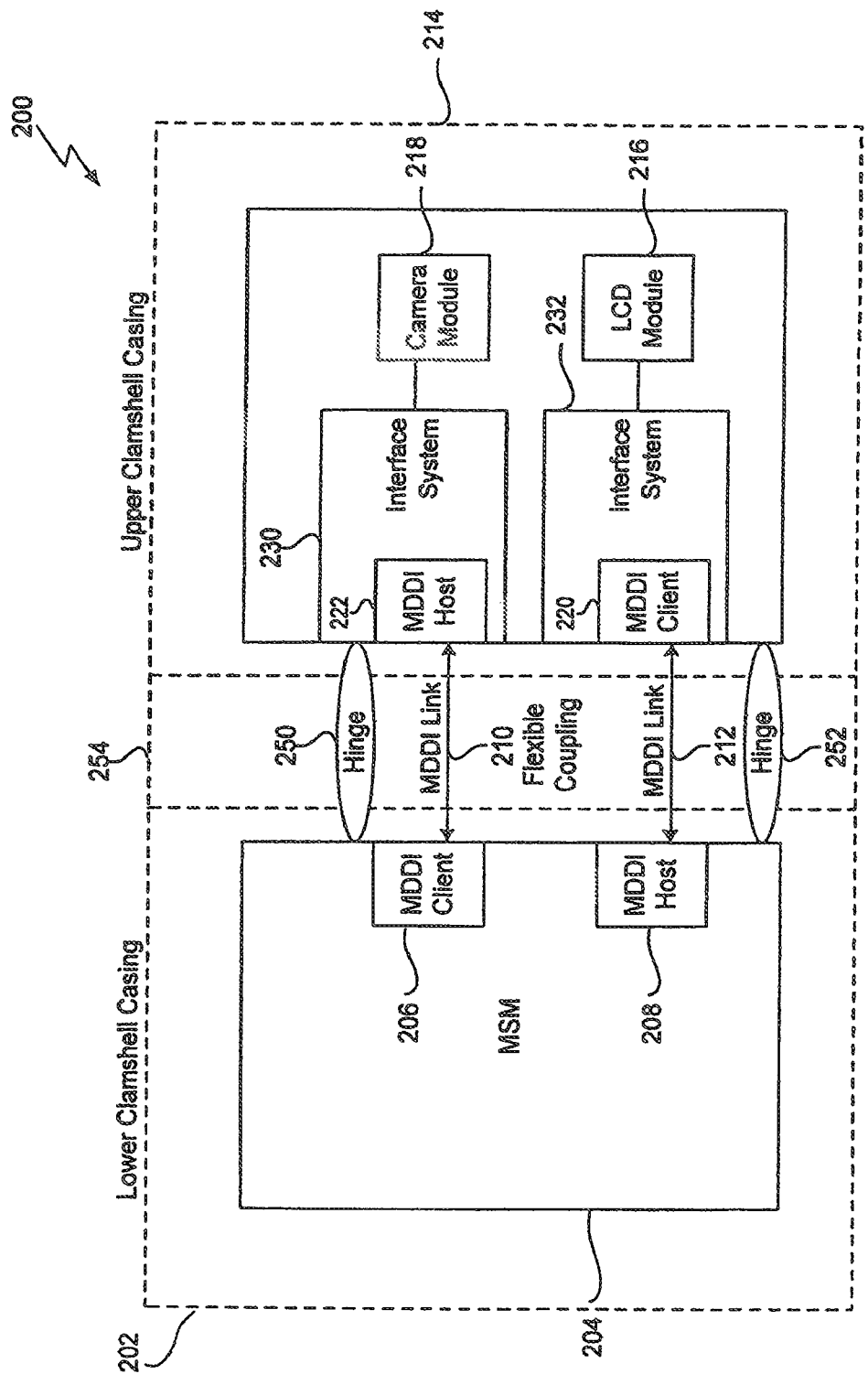
FIG. 2 is a block diagram of a cellular phone having upper and lower clamshell sections that uses an MDDI interface to provide high speed data communications.

FIG. 2 is a block diagram of a cellular telephone 200 having upper and lower clamshell sections that uses an MDDI interface to provide high speed data communications between components located in the upper and lower clamshells. The following discussion related to cellular telephone 200 provides an illustrative example that further shows the utility of digital data interface device 100 and provides additional details related to its implementation and use. Based on the discussions herein, use of a digital data interface device 100 with other devices, for example, a personal digital assistant and other types of mobile phones, will be apparent and are within the spirit and scope of the invention.

Referring to FIG. 2, a lower clamshell section 202 of cellular telephone 200 includes a Mobile Station Modem (MSM) baseband chip 204. MSM 204 is a digital baseband controller. An upper clamshell section 214 of cellular telephone 200 includes a Liquid Crystal Display (LCD) module 216 and a camera module 218. Both lower clamshell section 202 and upper clamshell section 214 are encased in plastic as is typically used with cellular phones. Hinges 250 and 252 mechanically connect lower clamshell 202 to upper clamshell 214. Flexible coupling 254 provides electrical coupling between lower clamshell 202 and upper clamshell 214.

MDDI link 210 connects camera module 218 to MSM 204. Typically, an MDDI link controller is provided for each of camera module 218 and MSM 204. Within cellular telephone 200, for example, an MDDI Host 222 is integrated into interface system 230 which is coupled to camera module 212, while an MDDI Client 206 resides on the MSM side of the MDDI link 210. Typically, the MDDI host is the master controller of the MDDI link.

In cellular telephone 200 pixel data from camera module 218 are received and formatted into MDDI packets by interface system 230 using MDDI Host 222 before being transmitted onto MDDI link 210. MDDI client 206 receives the MDDI packets and re-converts them into pixel data of the same format as generated by camera module 218. The pixel data are then sent to an appropriate block in MSM 204 for processing.

Similarly, MDDI link 212 connects LCD module 216 to MSM 204. MDDI link 212 interconnects an MDDI Host 208, integrated into MSM 204, and an MDDI Client 220 integrated into interface system 232 which is coupled to LCD module 216. Display data generated by a graphics controller of MSM 204 are received and formatted into MDDI packets by MDDI Host 208 before being transmitted onto MDDI link 212. MDDI client 220 receives the MDDI packets and re-converts them into display data and processes the display data through interface system 232 for use by LCD module 216.

Interface systems 230 and 232 represent different embodiments of digital data device interface 100. In the case of interface system 230, digital data device interface 100 elements will be implemented to support data transfer of camera images and camera control functions for a camera. In the case of interface system 232, digital data device interface 100 elements will be implemented to support data display to an LCD and control functions for the LCD. Interface system 230 is further explained to illustrate an embodiment of digital data device interface 100 when used in a cellular telephone with a camera, such as cellular telephone 200 with camera module 218.

The relationship between the devices in FIG. 1 and cellular telephone 200 is as follows. Digital data device interface 100 is represented by interface system 230. Link controller 140 is represented by MDDI Host 222. Peripheral 180 is represented by camera module 218. System controller 160 is represented by MSM 204 and link controller 170 is represented by MDDI client 206.

Figure 3:
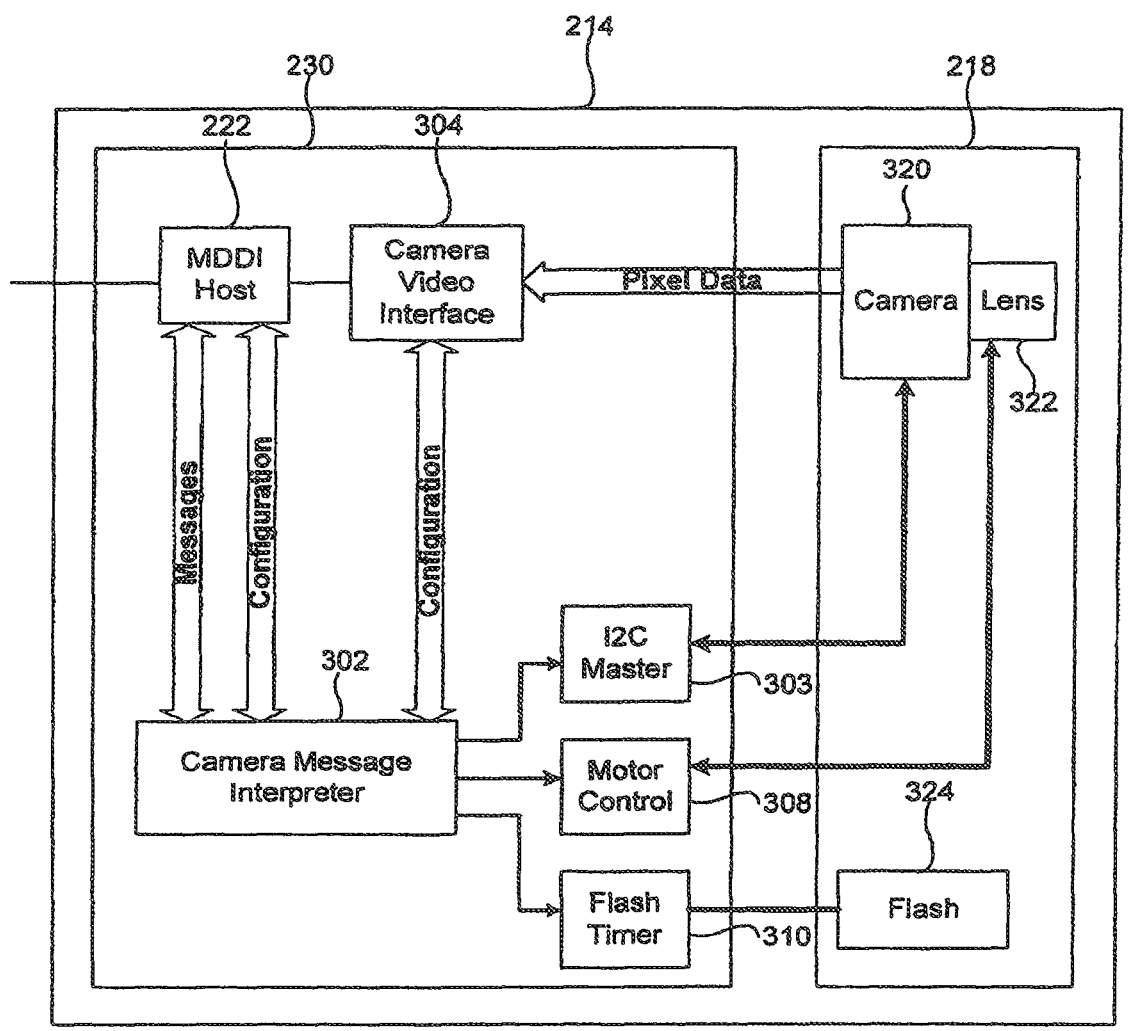
FIG. 3 is a diagram of an upper clamshell of a cellular phone with a camera.

FIG. 3 is a diagram of upper clamshell 214 and provides further details related to interface system 230 to highlight the example embodiment of digital data device interface 100 as used within a cellular telephone with a camera. Interface system 230 includes MDDI host 222, camera message interpreter 302, camera video interface 304, I2C master 303, motor control 308 and flash/white LED timer 310. The I2C bus is a commonly used control bus that provides a communication link between circuits. The I2C bus was developed by Philips Electronics N.V. in the 1980s.

Recall that interface system 230 corresponds to digital data device interface 100. The components of interface system 230 correspond to the components of digital data device interface 100 in the following manner. Camera message interpreter 302 corresponds to message interpreter module 100. Camera video interface 304 corresponds to content module 120. Collectively, I2C master 303, motor control 308 and flash/white LED timer 310 correspond to control module 130.

Camera message interpreter 302 receives commands and generates response messages through MDDI host 222 to MSM 204. Camera message interpreter 302 interprets the messages and routes the information content to the appropriate block within interface system 230, which can be referred to as an MDDI camera interface device. Camera video interface 304 receives image data from camera 320, stores the image data, and transfers the image data to MDDI host 222. Collectively, I2C master 306, motor control 308 and flash/ white LED timer 310 form a camera control block. In this case I2C master 306 provide controls for managing camera 320, motor control 308 provides controls for managing lens 322 (e.g., lens zoom functions), and flash/white LED timer 310 provides controls for managing flash/white LED 324 (e.g., flash brightness and duration.)

Figure 4A:
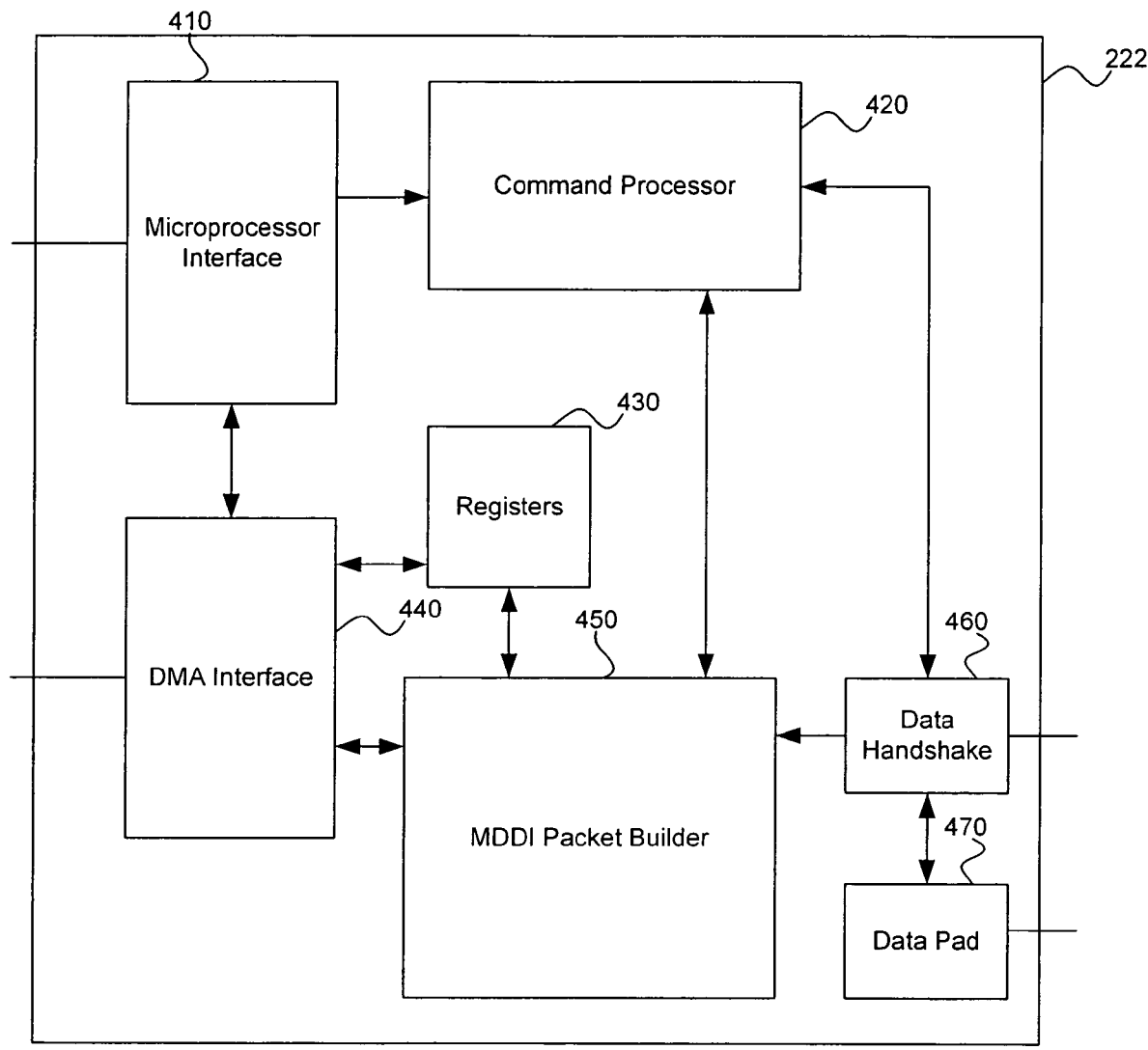
FIG. 4A is a diagram of an MDDI host.

FIG. 4A is a diagram of MDDI Host 222. MDDI Host 222 includes microprocessor interface 410, command processor 420, registers 430, Direct Memory Access (DMA) interface 440, MDDI packet builder 450, data handshake module 460 and data pad 470. Microprocessor interface 410 interfaces with a bus to a host processor that controls MDDI host 222. The host processor uses microprocessor interface 410 to set registers, read registers and issue commands to MDDI host 222. Microprocessor interface 410 looks at address values and passes the data off to the appropriate module within MDDI host 222, including the passing of writes to command processor 420 and reads and writes to registers values within registers 430.

Command processor 420 processes commands received from the host processor. The commands include powering down MDDI link 210, powering MDDI link 210 up, resetting MDDI host 222, and generating certain types of data packets.

Registers 430 store registers for the transmission of data across MDDI link 210. The registers within registers 430 control the behavior of MDDI link 210, as well as the configuration of MDDI host 222.

DMA interface 440 provides burst requests to external memory to receive information from interface system 230 to buffer data for MDDI packet builder 450. DMA interface 440 parses data of link list node headers and adjusts pointers to read the actual packet data. DMA interface 440 presents the information about the next data packet to send out to MDDI packet builder 450.

MDDI packet builder 450 makes decisions about what packet to send next as well as building the physical packets that will need to go over MDDI link 222. The packets are built from internal registers, counters, and data retrieved by DMA interface 440. When data is to be output over MDDI link 222, output data can be generated from several sources. The first source of packets are control type packets that are generated internally to MDDI packet builder 450. Example packets include sub-frame header packets, fill packets and link shutdown packets. Another source of packets is through DMA interface 440. These packets include packets passed via linked lists. In other embodiments video data, when the peripherals include a video camera, can be passed directly to MDDI packet builder 450. Regardless of the source of the packets, all packets are processed through a CRC generator system that resides within MDDI packet builder 450.

Data handshake module 460 manages the physical MDDI link 210. This is accomplished with a state machine that is responsible for the handshaking process, data output, round trip delay measurements and reverse data. Data handshake module 460 receives data from MDDI packet builder 450 and pass the data out to data pad 470, which shifts the data out onto MDDI link 222.

Figure 4B:
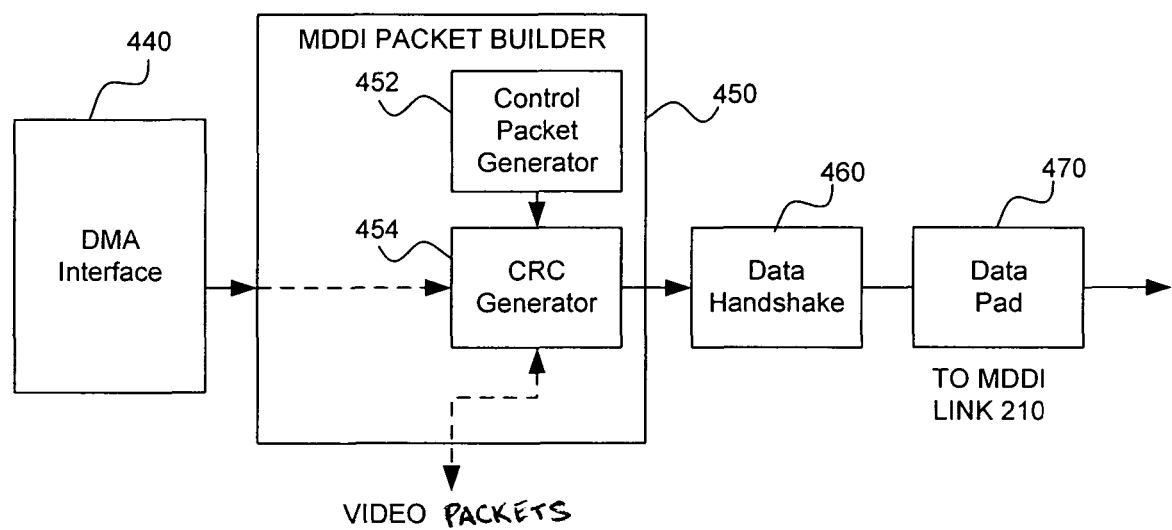
FIG. 4B is a diagram of the flow of packets from an MDDI packet builder to an MDDI link.

FIG. 4B illustrates the flow of packets to be provided out to MDDI Link 210. As indicated above, packets can be generated internally, received from DMA interface 440 or be directly received video packets. Internally generated packets are generated by control packet generator 452. All types of packets are passed through CRC generator system 454 to data handshake module 460. Data handshake module 460 in turn provides the packets to data pad 470, which places the data on MDDI link 210.

Figure 4C:
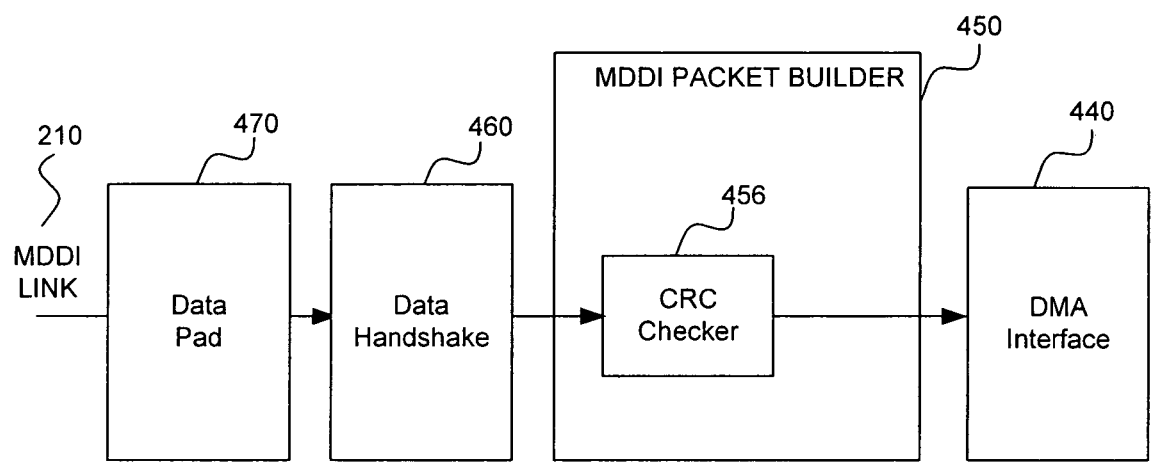
FIG. 4C is a diagram of the flow of packets received by an MDDI packet builder from an MDDI link.

FIG. 4C illustrates the flow of packets received over MDDI link 210 by MDDI packet builder 450. In this case, packets are received by data pad 470 from MDDI link 210, then passed to data handshake module 460. Data handshake module 460 passes the data to CRC checker 456 within MDDI packet builder 450. Once CRC checker 456 has verified the CRC of the incoming packet, the packet is provided to DMA interface 440 to be placed on a processor bus for distribution within digital data interface device 100.

Example packet types are described with reference to FIGS. 5 and 6. These example packets are used to illustrate the present invention, but are not intended to limit the invention to only these types of packets. Other packet types using unique patterns, as described below, and CRC fields can be used with the invention.

Figure 5:
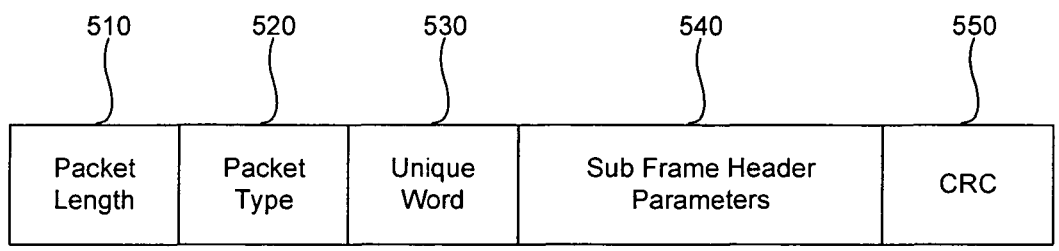
FIG. 5 is a diagram of a sub frame header packet format.

FIG. 5 is a diagram of a sub frame header packet format 500, according to the VESA MDDI Interface standard. Sub frame header packet format 500 includes a packet length field 510, a packet type length field 520, a unique word field 530, a sub-frame header parameter field 540 and a CRC field 550. Packet length field 510 includes a 16 bit (2 bytes) value that specifies the total number of bytes in a packet not including packet length field 510. Packet type field 520 includes a 16 bit unsigned integer that specifies the type of information contained in a packet. Unique word field 530 includes a 16 bit word that is unique. Both the unique word field and packet type field 520 are recognized to form a 32-bit unique pattern to align the data. That is, when receiving packets MDDI packet builder 450 can determine based on the unique pattern what portion or field of a data packet MDDI packet builder 450 is processing. Sub-frame header parameter field 540 includes control parameters for managing MDDI link 222. CRC field includes a 16 bit CRC value.

Figure 6:
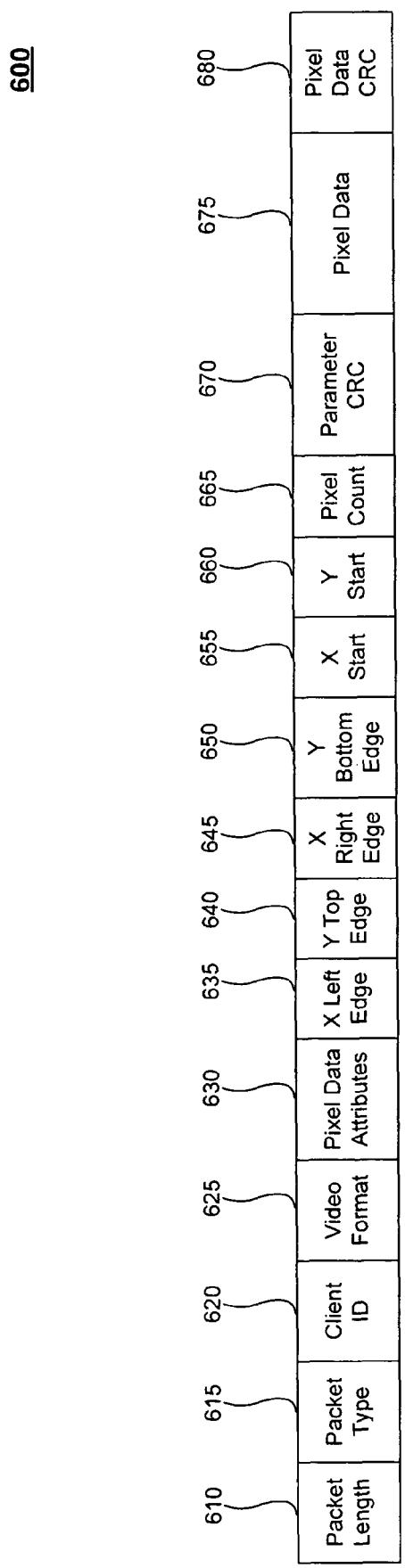
FIG. 6 is a diagram of a video stream packet format.

FIG. 6 is a diagram of a video stream packet format 600. Video stream packets carry video data to update a rectangular portion of a display. Video stream packet format 600 includes packet length field 610, packet type field 615, client ID field 620, video format field 625, pixel data attributes field 630, X left edge field 635, Y top edge field 640, X right edge field 645, y bottom edge field 650, X start field 655, Y start field 660, pixel count field 665, parameter CRC field 670, pixel data field 675, and pixel data CRC field 680.

Packet length field 610 includes a 16 bit (2 bytes) value that specifies the total number of bytes in a packet not including packet length field 610. Packet type field 620 includes a 2 byte unsigned integer that specifies the type of information contained in a packet.

Fields 620 through 665 are each 2 byte fields that contain parameter data related to how a video display should be formatted. The specific definitions for these fields can be found within the VESA MDDI Interface Standard. Parameter CRC field 670 is a two byte field that contains a CRC value generated by processing the parameter data in fields 610 through 665.

Pixel data field 675 includes any amount of pixel data up to an amount allowed by the size of the packet and the pixel count field. Pixel CRC field 680 is a two byte field that contains a CRC value generated by processing the pixel data within pixel data field 675.

Every packet sent over the MDDI link 210 will include at least one CRC field, such as CRC field 550 within sub-frame header packet format 500. In some longer packets, the packet will include two CRC fields, such as parameter CRC field 670 and pixel CRC field 680 within video stream packet format 600.

A CRC produces a small number of bits, from a large block of data, such as a packet of network traffic or a block of a computer file, in order to detect errors in transmission or storage. A CRC is computed as a function of the data to be sent and appended before transmission or storage (for example, with CRC field 550), and verified afterwards to confirm that no changes occurred.

A CRC is computed by pushing packet data through a CRC generator, such as CRC generator system 454, to create a unique CRC value associated with the packet data. A CRC checker, such as CRC checker 456, generates a received data CRC value based on the received data. The received data CRC value is then compared to the CRC value that was sent. If the two match, then the data is considered to be valid data, otherwise a CRC error is generated.

CRCs are popular because they are simple to implement in binary hardware, are easy to analyze mathematically, and are particularly good at detecting common errors caused by noise in transmission channels. Specific implementations for CRC generators will be known to individuals skilled in the relevant arts.

As illustrated in FIGS. 5 and 6, CRC fields appear at the end of the packets (e.g., CRC field 512 and Pixel data CRC field 680) and sometimes after certain more critical parameters in packets that may have a significantly large data field (e.g., Parameter CRC field 670), and thus, an increased likelihood of errors during transfer. In packets that have two CRC fields, the CRC generator, when only one is used, is re-initialized after the first CRC so that the CRC computations following a long data field are not affected by the parameters at the beginning of the packet.

There is a remote possibility for packets containing multiple bit errors to produce a good CRC. The probability of detecting a good CRC on a packet with errors approaches $7.6 \times 10^{-6}$ on very long packets containing many errors. By design, the MDDI link will have a very low or zero error rate. The CRC is intended to be used to monitor the health of the link, and is not intended to detect errors on specific packets to determine whether packets should be retransmitted.

Figure 4D:
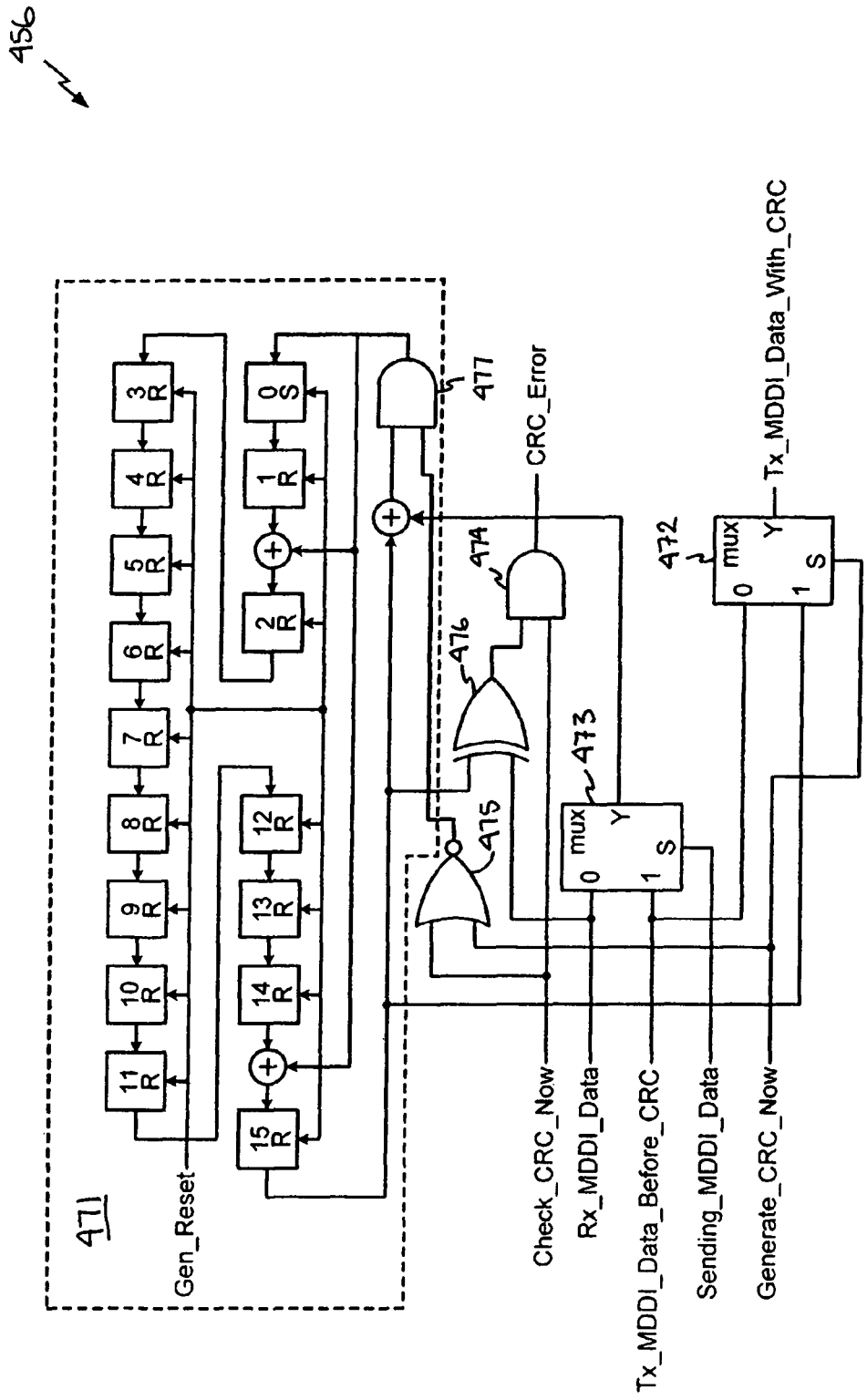
FIG. 4D is a diagram of a CRC checker.

In an exemplary embodiment, the polynomial used for the CRC calculation is known as the CRC-16, or $X16+X15+X2+X0$. A sample implementation of a CRC generator 454 and CRC checker 456 useful for implementing the invention is shown in FIG. 4D. In FIG. 4D, a CRC register 471 is initialized to a value of 0x0001 just prior to transfer of the first bit of a packet which is input on the Tx_MDDI_Data_Before_CRC line, then the bytes of the packet are shifted into the register starting with the LSB first. Note that the register bit numbers in this figure correspond to the order of the polynomial being used, and not the bit positions used by the MDDI. It is more efficient to shift the CRC register in a single direction, and this results in having CRC bit 15 appear in bit position 0 of the MDDI CRC field, and CRC register bit 14 in MDDI CRC field bit position 1, and so forth until MDDI bit position 14 is reached.

As an example, if the packet contents are: 0x000c, 0x0046, 0x000, 0x0400, 0x00, 0x00, 0x0000 (or represented as a sequence of bytes as: 0x0c, 0x00, 0x46, 0x00, 0x00, 0x00, 0x00, 0x04, 0x00, 0x00, 0x00, 0x00), and are submitted using the inputs of the multiplexors 472 and 473, and AND gate 474, the resulting CRC output on the Tx_MDDI_Data_With_CRC line is 0xd9aa (or represented as a sequence as 0xaa, 0xd9).

When CRC generator 454 and CRC checker 456 is configured as a CRC checker, the CRC that is received on the Rx_MDDI_Data line is input to multiplexor 472 and exclusive-OR (XOR) gate 476, and is compared bit by bit with the value found in the CRC register using NOR gate 475, AND gate 474, and AND gate 477. If there are any errors, as output by AND gate 477, the CRC is incremented once for every packet that contains a CRC error by connecting the output of gate 477 to the input of register 471. Note that the example circuit shown in the diagram of FIG. 4D can output more than one CRC error signal within a given CHECK_CRC_NOW window (see FIG. 4E). Therefore, the CRC error counter generally only counts the first CRC error instance within each interval where CHECK_CRC_NOW is active. If configured as a CRC generator the CRC is clocked out of the CRC register at the time coinciding with the end of the packet.

The timing for the input and output signals, and the enabling signals, is illustrated graphically in FIGS. 4E and 4F. The generation of a CRC and transmission of a packet of data are shown in FIG. 4E with the state (0 or 1) of the Gen_Reset, Check_CRC_Now, Generate_CRC_Now, and Sending_MDDI_Data signals, along with the Tx_MDDI_Data_Before_CRC and Tx_MDDI_Data_With_CRC signals. The reception of a packet of data and checking of the CRC value are shown in FIG. 4F, with the state of the Gen_Reset, Check_CRC_Now, Generate_CRC_Now, and Sending_MDDI_Data signals, along with the Rx_MDDI_Data and CRC error signals.

The presence of CRCs within packets presents operational challenges and also affords various opportunities to more efficiently utilize MDDI Link 210. While the discussions focus on CRC uses in the context of MDDI link 210, the present invention is not limited to the MDDI context. The present invention can be applied to any type of digital data transmission link in which CRCs are used.

One challenge associated with the use of CRCs relates to link initialization. When a link is brought up, a sub frame header packet, such as sub-frame header packet 500, will be sent by MDDI host 222 to MDDI client 206. Upon link initialization, ordinarily CRC checker 456 would not know the alignment of data within the data stream. That is, it would not know, for example, whether it was processing data within the unique word field 530 or CRC field 550. As a result CRC checker 456 would need to continually queue data into memory until it recognized where within the data stream it was. This leads to inefficiencies and requires more memory and chip area used to queue and store data. Without knowing the precise location within the data stream, CRC checker 456 would not be able to generate a CRC that could be compared to a received CRC to validate the received data.

Figure 7:
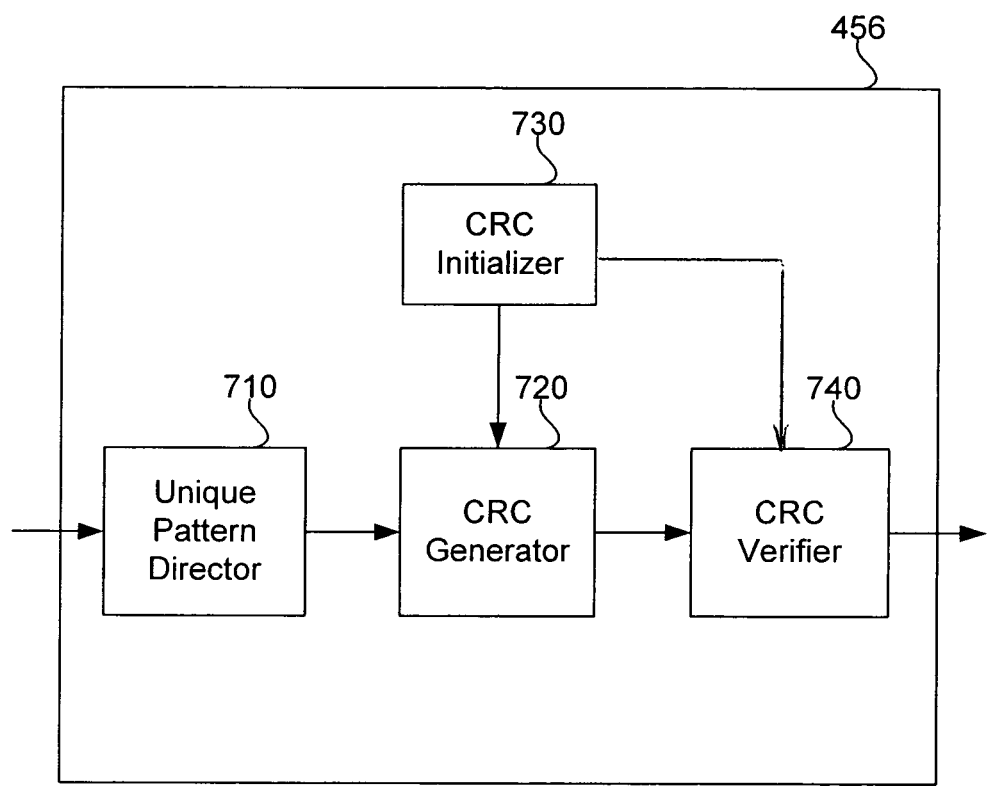
FIG. 7 is a diagram of a CRC checker.

FIG. 7 is a diagram of a CRC checker 456 that addresses these challenges. CRC checker 456 includes unique pattern detector 710, CRC generator 720, CRC initializer 730 and CRC verifier 740. Unique pattern detector 710 detects a unique pattern within an incoming data stream to identify a particular point in the data stream. CRC generator 720 is a standard CRC generator used to generate CRC values associated with received data. CRC initializer 730 pumps CRC generator 720 with the data values associated with the unique pattern and packet length. CRC verifier 740 compares the received CRC value to the CRC value generated by CRC generator 720 based on the received data to validate the data.

Figure 8:
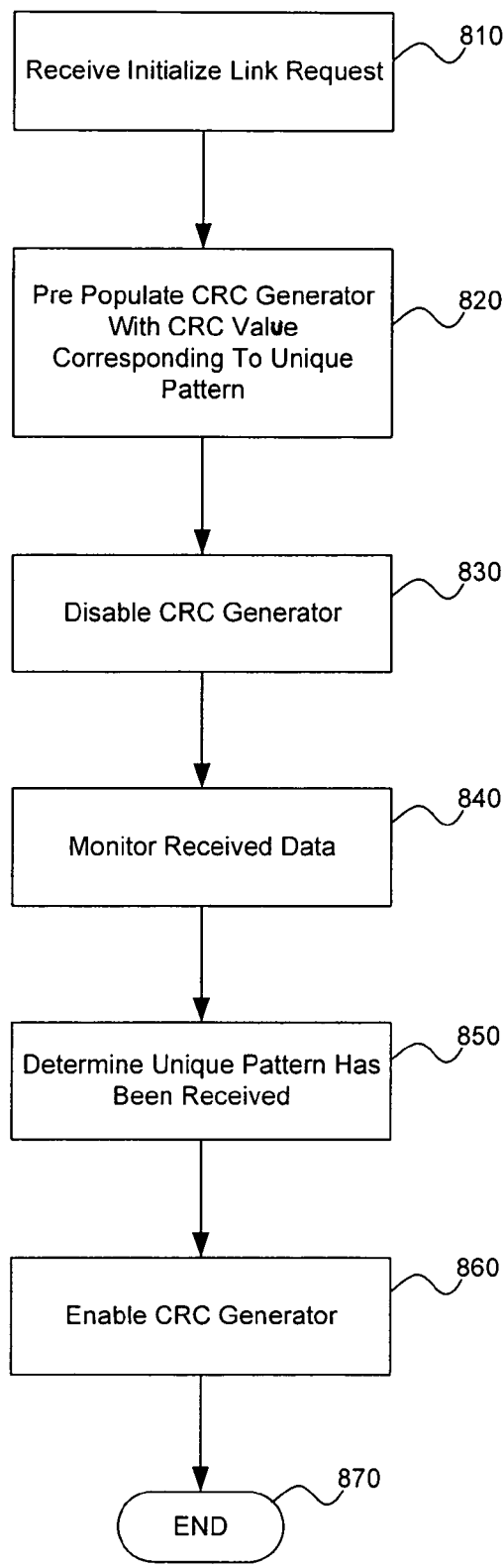
FIG. 8 is a flowchart of a method to initialize a link involving prepopulation of a CRC generator.

FIG. 8 is a flowchart of method 800 to initialize a link that demonstrates the use of CRC checker 456 as depicted in FIG. 7. In one approach, the packet length of a subframe header is assumed to always be the same, and a pre-calculated value is loaded into a CRC checker which is a partial CRC based on the packet length, packet type and unique word. An alternative approach supports the situation where the packet length is variable. In this situation, the packet length along with the unique pattern could be pumped through a pre-calculator to create a value that would then be placed in the CRC checker at the point when the unique pattern has been received.

Method 800 begins in step 810. In step 810, a request to initialize or wake-up a transmission link is received. For example, MDDI client 206 could receive a request from MDDI host 222 to initialize or wake-up MDDI link 210. Within MDDI client 206, CRC checker 456 would be initialized by this link wake-up request. In particular, CRC initializer 730 would be initialized by the request.

In step 820, a CRC generator is pre-populated with the data values associated with the unique pattern and the packet length field 510, such that the CRC values associated with the unique pattern and packet length field can be generated by the CRC generator. As indicated above, in one embodiment, the packet length field is assumed to be fixed. For example, CRC initializer 730 can provide the unique pattern and packet length field to CRC generator 720. In the case of MDDI, the unique pattern is the data values associated with the data contained within the packet type field 520 and unique word field 530. Upon waking up a link, the values of these fields will be known a priori. Thus, CRC initializer 730 can store them and be in a position to provide them to CRC generator 730 when a wake-up link request is received. In an alternative approach, rather that provide the data values to a CRC generator, a CRC checker can be preloaded with the precalculated CRC value that would have been generated by a CRC generator had the unique pattern and packet length field been provided to the CRC generator.

In step 830, a CRC generator, such as CRC generator 720, is disabled. The generator is disabled so as to not process further data that would change the CRC value until the unique pattern and packet length field are received.

In step 840, incoming data is monitored to check for receipt of the unique data pattern. For example, unique pattern detector 710 monitors the received data from MDDI link 210.

In step 850, a determination is made that the unique pattern has been received. For example, unique pattern detector 710 determines that packet length field 510, packet type field 520 and unique word field 530 have been received.

In step 860, the CRC generator is enabled. Upon being enabled, CRC generator 720 will build upon the existing CRC value that was generated using the preloaded unique pattern. As a result, CRC generator 720 is immediately aligned with the data, and there is no need to queue or store data in memory. Upon receipt of the CRC value contained in CRC field 550, CRC verifier 740 can compare the value within CRC field 550 to the value generated by CRC generator 720 to determine whether a CRC error exists. In step 870, method 800 ends.

Ordinarily, CRC values are used to determine whether a problem on a transmission link corrupted the data during transmission. In another aspect of the invention, CRC values are used to convey information related to system errors and status. In this way, the CRC fields within messages can be used more efficiently to support both identification of transmission link problems and system status or error information.

In one embodiment of the invention, the CRC field data is corrupted to indicate simply that something is wrong with the system transmitting the data and therefore there may be problems with the data that is being received. For example, in some cases the data going out over MDDI link 210 would be corrupted because the data coming into MDDI packet builder 450 was not received quickly enough. Even though insufficient data was available for the packet, the MDDI specification states that a packet still should be sent. Thus, even though a packet is sent the data may not be valid or in some way insufficient.

In this case, the CRC value, such as parameter CRC 670 or pixel data CRC 680 could be intentionally corrupted, so that MDDI client 206 can recognize that something happened to impair the integrity of the packet that was transmitted. Within the MDDI specification, this is a way to advise MDDI client 206 that there was a problem with the data. Alternatively, another message would need to be sent that follows the packet containing the errors that in effect says, 'the last packet that I sent was bad.'

When MDDI client 206 receives a packet in which the CRC value has been intentionally corrupted, it makes a decision on how to handle the packet. Algorithms can be developed to detect and determine how to handle a packet having an intentionally corrupted CRC value. For certain types of packets MDDI client 206 may simply record a CRC error and continue to use the data. While in other situations, MDDI client 206 may discard the received packet and request a new packet.

For example, within video packets, such as video stream packet 600, if the pixel data CRC value 680 is intentionally corrupted, MDDI client 220 would not notify the logic outside of MDDI client 220 that a packet was corrupted. In this case, the received data could be buffered before providing any sort of error notification. There is not enough memory to buffer potentially all of the video data (i.e., all pixel data to be displayed). Thus, as soon as pixel data is received it is provided to the display. As a result if there is a CRC error somewhere in the video information, it is too late to stop the video information from being used. In this case, nothing is done other than to record that a problem had occurred. In summary, if an intentionally corrupted CRC error occurs in the pixel data and not in the parameter data, the MDDI client simply records the CRC error in an error counter, but still uses the subsequent pixel data. If, on the other hand, a parameter CRC value is intentionally corrupted, then the MDDI client will not use the pixel data.

Figure 9:
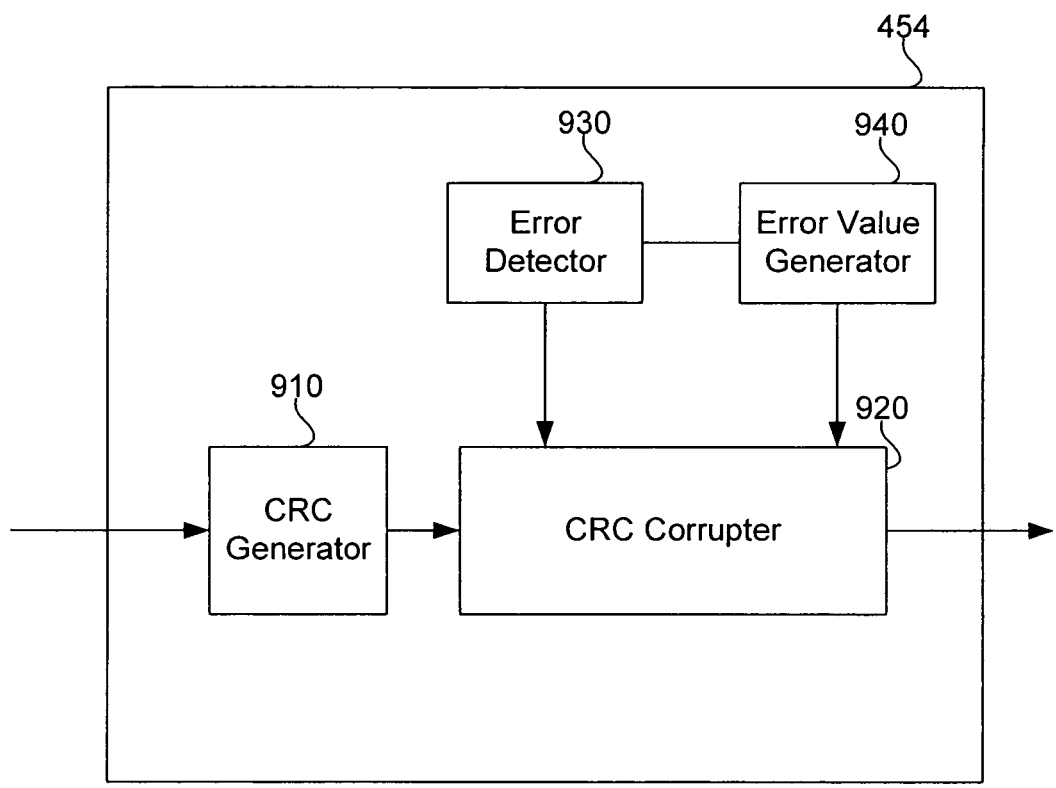
FIG. 9 is a diagram of a CRC generator system that provides a mechanism to intentionally corrupt a CRC value.

FIG. 9 is a diagram of cyclic redundancy generator system 454 that provides a mechanism to intentionally corrupt a CRC value. Cycle redundancy generator system 454 includes CRC generator 910, CRC corrupter 920, error detector 930 and error value generator 940.

CRC generator 910 generates a CRC value based on data to be included in a data packet to be transmitted over a digital transmission link, such as, but not limited to, MDDI link 210.

CRC corrupter 920 corrupts a CRC value generated by CRC generator 910 to convey host or remote system status information. For example, if interface system 230 is unable to provide data quickly enough to MDDI host 222 to properly populate an MDDI packet, CRC corrupter 920 intentionally corrupts the CRC value of the packet to be sent.

Error detector 930 detects an error condition within a host system, such as either MDDI host 222, or receives error condition information based on information received from interface system 230 and provides instructions for the CRC corrupter 920 to intentionally corrupt a CRC value. In one embodiment, error detector 930 simply detects that something is wrong, but does not determine a specific error condition. In another embodiment, error detector 930 determines a specific type of error condition. In the latter embodiment, error detector 930 conveys the nature of the error to error value generator 940. Error value generator 940 instructs CRC corrupter 940 to replace a CRC value generated by the CRC generator 910 with a specific value that indicates a type of system error or status condition.

When corrupting the CRC value, algorithms must be chosen to ensure that the intentional corruption does not lead to a CRC value that could correspond to valid data, and therefore would not be received as a unique CRC value by a CRC checker on the receiving end of a transmission link. One possible algorithm would be to identify those CRC values that would not be produced by valid data, and use those values as the unique values for intentionally corrupting a CRC value. Based on the teachings herein, individuals skilled in the relevant arts will determine other algorithms, which are included within the spirit and scope of the present invention.

Figure 10:
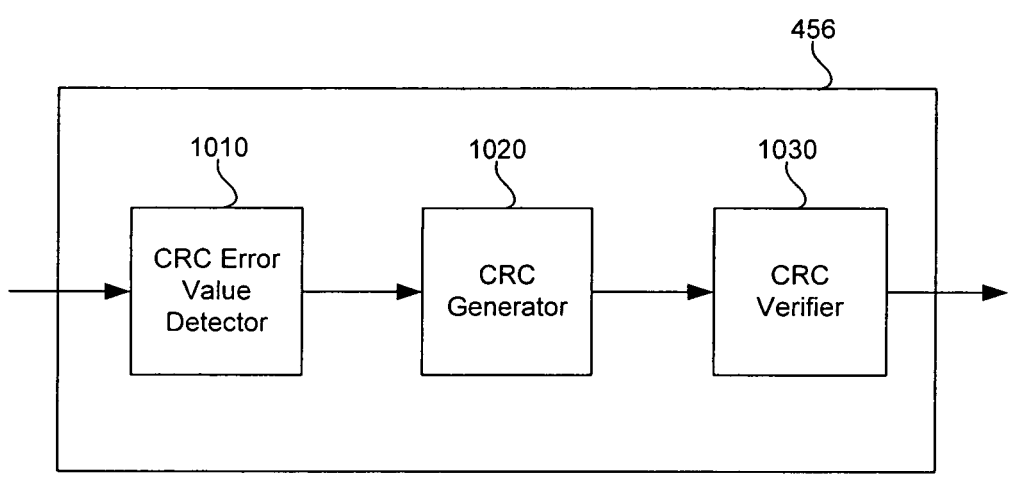
FIG. 10 is a diagram of a CRC checker that can interpret intentionally corrupted CRC values.

FIG. 10 is a diagram of a CRC checker 456 that can interpret intentionally corrupted CRC values from CRC generator system 454. CRC checker 456 includes CRC error value detector 1010, CRC generator 1020 and CRC verifier 1030. CRC error value detector 1010 detects values within a CRC field of a data packet received over a digital transmission link. CRC error value detector 1010 identifies when a CRC value corresponds to an intentionally corrupted CRC value that identifies a system error condition. When a CRC value is identified that corresponds to system error condition, CRC error value detector 1010 notifies the host processor of the receiving client, such as MDDI client 206. The host processor would then take action based on the type of error detected. CRC generator 1020 generates CRC values based on a received data stream. CRC verifier 1030 detects differences between a CRC value generated based on a received data stream to a CRC value that was sent within the received data stream. CRC generator 1020 and CRC verifier 1030 operate in a traditional manner that will be known to individuals skilled in the relevant arts.

Figure 11:
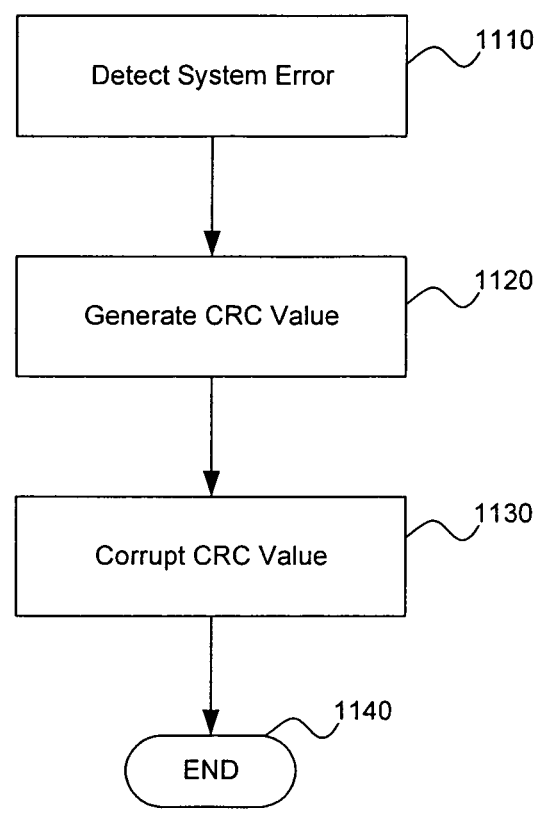
FIG. 11 is a flowchart of a method to transmit system error information over a digital transmission link by intentionally corrupting a CRC value.

FIG. 11 is a flowchart of method 1100 to transmit system error information over a digital transmission link by intentionally corrupting a CRC value. Method 1100 begins in step 1110. In step 1110, an error within a host system or related system is detected. For example, error detector 930 detects an error within MDDI host 222 or interface system 230. In step 1120 a CRC value is generated. For example, CRC generator 910 generates a CRC value for data associated with a packet to be sent. In step 1130, the CRC value is corrupted. For example, error detector 930 instructs CRC corrupter 920 to corrupt a CRC value. In step 1140, method 1100 ends. Note that while method 1100 has been described with reference to a system involving MDDI, method 1100 is applicable to any digital transmission system in which CRCs are used.

Within the present invention, CRC fields may also be used to transmit error code information to represent types of errors. Whenever only data packets and CRC are being transferred between the host and client, there are no error codes being accommodated. The only error is a loss of synchronization. Otherwise, one has to wait for the link to timeout from a lack of a good data transfer path or pipeline and then reset the link and proceed. Unfortunately, this is time consuming and somewhat inefficient.

For use in one embodiment, a new technique has been developed in which the CRC portion of packets is used to transfer error code information. That is, one or more error codes are generated by the processors or devices handling the data transfer which indicate specific predefined errors or flaws that might occur within the communication processing or link. When an error is encountered, that the appropriate error code is generated and transferred using the bits for the CRC of a packet. That is, the CRC value is overloaded, or overwritten, with the desired error code, which can be detected on the receiving end by an error monitor or checker that monitors the values of the CRC field. For those cases in which the error code matches the CRC value for some reason, the compliment of the error is transferred to prevent confusion.

In one embodiment, to provide a robust error warning and detection system, the error code may be transferred several times, using a series of packets, generally all, that are transferred or sent after the error has been detected. This occurs until the point at which the condition creating the error is cleared from the system, at which point the regular CRC bits are transferred without overloading by another value.

This technique of overloading the CRC value provides a much quicker response to system errors while using a minimal amount of extra bits or fields.

Figure 12:
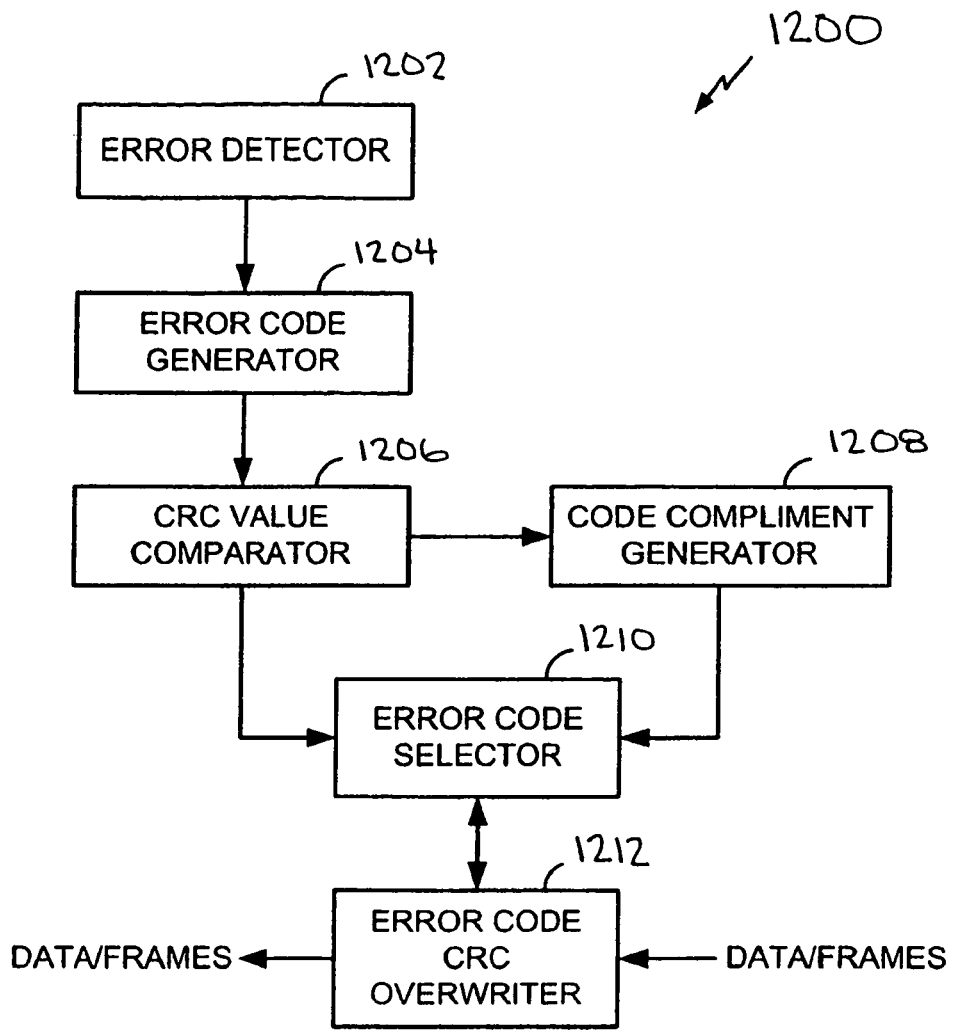
FIG. 12 is a diagram of a CRC overwriting mechanism.

As shown in FIG. 12, a CRC overwriting mechanism or apparatus 1200 is shown using an error detector or detections means 1202, such as error detector 930, which can form part of other circuitry previously described or known, detects the presence or existence of errors within the communication link or process. An error code generator or means 1204, such as error value generator 940, which can be formed as part of other circuitry or use techniques such as look up tables to store pre-selected error messages, generates one or more error codes to indicate specific predefined errors or flaws that have been detected as occurring. It is readily understood that devices 1202 and 1204 can be formed as a single circuit or device as desired, or as part of a programmed sequence of steps for other known processors and elements.

A CRC value comparator or comparison means 1206, such as CRC verifier 1030, is shown for checking to see if the selected error code or codes are the same as the CRC value being transferred. If that is the case then a code compliment generator or generation means or device is used to provide the compliment of the error codes as to not be mistaken as the original CRC pattern or value and confuse or complicate the detection scheme. An error code selector or selection means element or device 1210 then selects the error code or value it is desired to insert or overwrite, or their respective compliments as appropriate. An error code CRC over-writer or over writing mechanism or means 1212, such as CRC corrupter 920, is a device that receives the data stream, packets, and the desired codes to be inserted and overwrites the corresponding or appropriate CRC values, in order to transfer the desired error codes to a receiving device.

As mentioned, the error code may be transferred several times, using a series of packets, so the over-writer 1212 may utilize memory storage elements in order to maintain copies of the codes during processing or recall these codes from previous elements or other known storage locations which can be used to store or hold their values as needed, or as desired.

Figure 13:
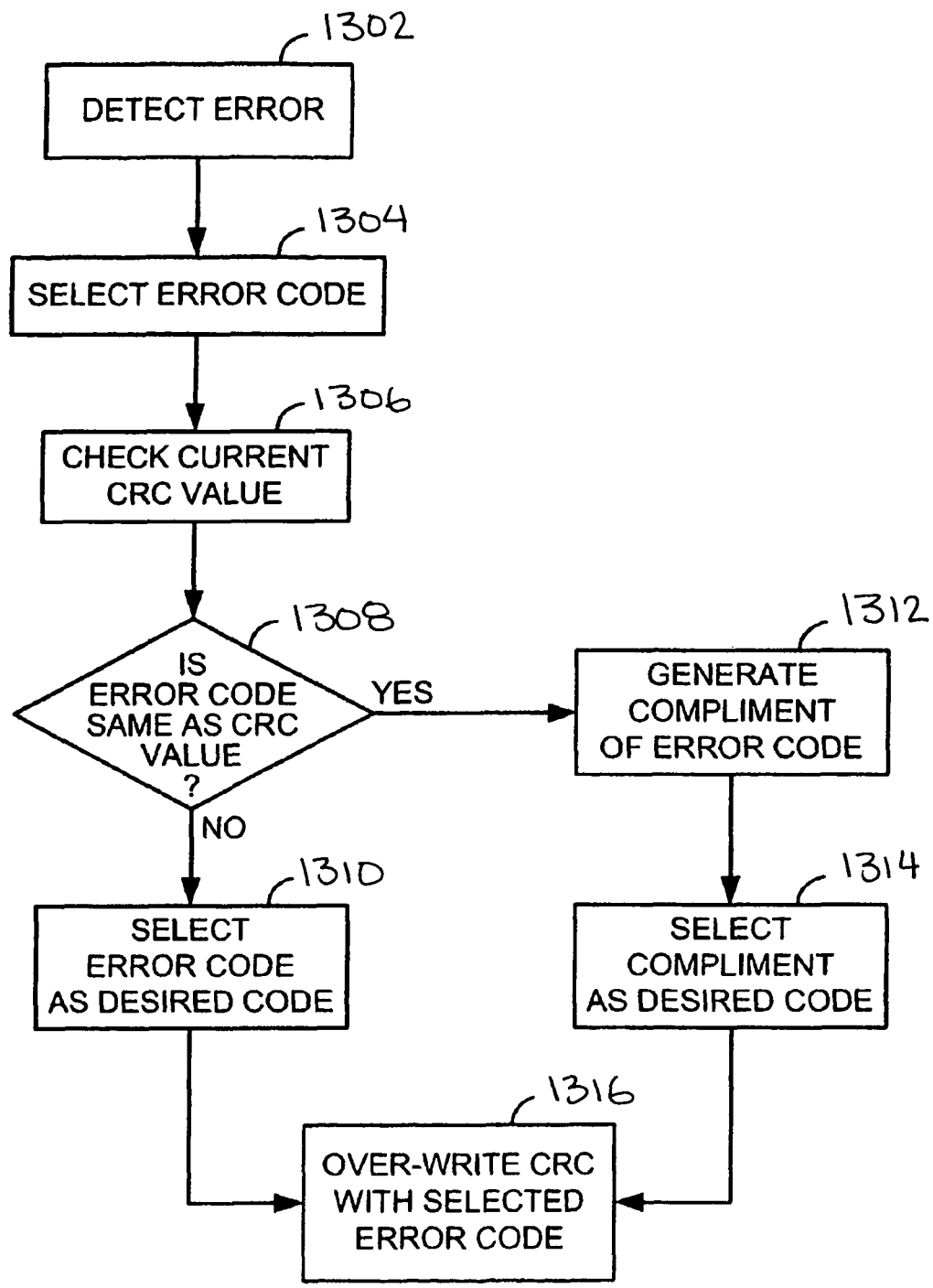
FIG. 13 is a flowchart of a method of CRC overwriting.
Figure 14:
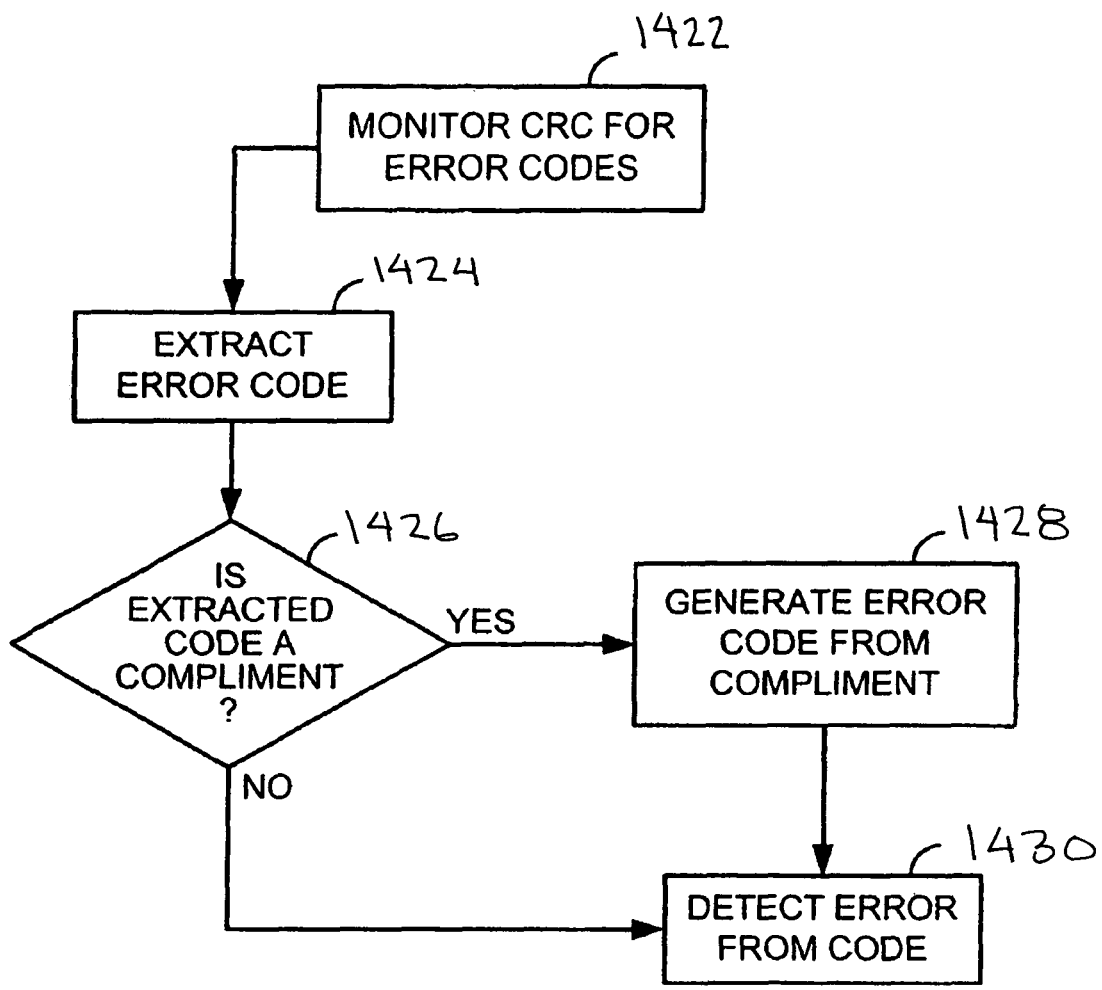
FIG. 14 is a flowchart of a method receiving a CRC value that has been overwritten.

The general processing of the overwriting mechanism of FIG. 12 is implementing is shown in additional detail in FIGS. 13 and 14. In FIG. 13, one or more error is detected in step 1302 in the communication data or process and an error code is selected in step 1304 to indicate this condition. At the same time, or at an appropriate point, the CRC value to be replaced is checked in a step 1306, and compared to the desired error code in step 1308. The result of this comparison, as discussed earlier, is a determination as to whether or not the desired code, or other representative values, will be the same as the CRC value present. If this is the case, then processing proceeds to a step 1312 where the compliment, or in some cases another representative value, as desired, is selected as the code to insert. One it has been determined what error codes or values are to be inserted in steps 1310 and 1314, that appropriate code is selected for insertion. These steps are illustrated as separate for purposes of clarity but generally represent a single choice based on the output of the step 1308 decision. Finally, in step 1316 the appropriate values are overwritten in the CRC location for transfer with the packets being targeted by the process.

On the packet reception side, as shown in FIG. 14, the packet CRC values are being monitored in a step 1422. Generally, the CRC values are being monitored by one or more processes within the system to determine if an error in data transfer has occurred and whether or not to request a retransmission of the packet or packets, or to inhibit further operations and so forth, some of which is discussed above. As part of such monitoring the information can also be used to compare values to known or pre-selected error codes, or representative values and detect the presence of errors. Alternatively, a separate error detection process and monitor can be implemented. If a code appears to be present it is extracted or otherwise noted in step 1424 for further processing. A determination can be made in step 1426 as to whether or not this is the actual code or a compliment, in which case an additional step 1428 is used to translate the value to the desired code value. In either case the resulting extracted code, compliment, or other recovered values are then used to detect what error has occurred form the transmitted code in step 1430.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A cyclic redundancy check (CRC) checker system, comprising:
    a host cyclic redundancy check (CRC) generator that generates a CRC value based on a transmitted data stream and a CRC corrupter that corrupts the generated CRC value to a specific corrupted CRC error value that corresponds to a specific system error or status condition detected by the host;
    a selector at the host that sends the generated CRC value or the corrupted CRC error value in a CRC field of a data packet in the transmitted data stream;
    a client generator at the client that generates a client CRC unique pattern based on the data stream received from the host;
    a CRC verifier at the client to detect an error condition by comparing the client CRC unique pattern with the generated CRC value from the host;
    a CRC error value detector at the client that detects the corrupted CRC error value generated by the host that corresponds to the specific system error or status condition; and
    an instructor at the client for instructing the client to take specific corrective action based on the corrupted CRC error value detected by the CRC error value detector.

2. The cyclic redundancy check (CRC) checker system of claim 1 wherein the error condition comprises an error in the data stream.

3. The cyclic redundancy check (CRC) checker system of claim 1 wherein the specific error or status condition comprises at least one member from the group consisting of identification of transmission link information, system status information and system error information.

4. The cyclic redundancy check (CRC) checker system of claim 1 further comprising a recorder at the client for recording the corrupted CRC error value.

5. The cyclic redundancy check (CRC) checker system of claim 1 further comprising an error detector at the host for detecting the specific system error or status condition.

6. The cyclic redundancy check (CRC) checker system of claim 1, further comprising a MDDI transmission link.

7. A method for checking a cyclic redundancy check (CRC) in a digital transmission system, the method comprising the steps of:
    generating a host cyclic redundancy check (CRC) that generates a CRC value based on a transmitted data stream and corrupting the generated CRC value to a specific corrupted CRC error value that corresponds to a specific system error or status condition detected by the host;
    selecting the generated CRC value or the corrupted CRC error value by the host for transmission in a CRC field of a data packet in the transmitted data stream;
    generating a client CRC unique pattern at the client based on the data stream received from the host;
    detecting an error condition at the client by comparing the client CRC unique pattern with the generated CRC value from the host;
    detecting the corrupted CRC error value generated by the host at the client that corresponds to the specific system error or status condition; and
    instructing the client to take specific corrective action based on the detected corrupted CRC error value.

8. The method of claim 7 wherein the error condition comprises an error in the data stream.

9. The method of claim 7 wherein the specific error or status condition comprises at least one member from the group consisting of identification of transmission link information, system status information and system error information.

10. The method of claim 7 further comprising the step of recording the corrupted CRC error value by the client.

11. The method of claim 7 further comprising the step of detecting the specific system error or status condition by the host.

12. The method of claim 7, wherein the system includes a MDDI transmission link.

13. A machine readable medium for storing executable program instructions to implement a checker system for a cyclic redundancy check (CRC) in a digital transmission system, the medium for storing comprising:
    program instructions that cause a generation of a host cyclic redundancy check (CRC) that generates a CRC value based on a transmitted data stream and a corruption of the generated CRC value to a specific corrupted CRC error value that corresponds to a specific system error or status condition detected by the host;
    program instructions that cause a selection of the generated CRC value or the corrupted CRC error value by the host for transmission in a CRC field of a data packet in the transmitted data stream;
    program instructions that cause a generation of a client CRC unique pattern at the client based on the data stream received from the host;
    program instructions that cause a detection of an error condition at the client by comparing the client CRC unique pattern with the generated CRC value from the host;

program instructions that cause a detection of the corrupted CRC error value generated by the host at the client that corresponds to the specific system error or status condition; and instructing the client to take specific corrective action based on the detected corrupted CRC error value.

14. The machine readable medium of claim 13 wherein the error condition comprises an error in the data stream.

15. The machine readable medium of claim 13 wherein the specific error or status condition comprises at least one member from the group consisting of identification of transmission link information, system status information and system error information.

16. The machine readable medium of claim 13 further comprising program instructions that cause a recordation of the corrupted CRC error value by the client.

17. The machine readable medium of claim 13 further comprising program instructions for causing a detection of the specific system error or status condition by the host.

18. The machine readable medium of claim 13, wherein the system includes a MDDI transmission link.

19. A cyclic redundancy check (CRC) checker system, comprising:

means for generating a host cyclic redundancy check (CRC) that generates a CRC value based on a transmitted data stream and means for corrupting the generated CRC value to a specific corrupted CRC error value that corresponds to a specific system error or status condition detected by the host;

means for selecting the generated CRC value or the corrupted CRC error value for transmission in a CRC field of a data packet in the transmitted data stream;

means for generating a client CRC unique pattern at the client based on the data stream received from the host over a digital transmission link;

means for detecting an error condition at the client by comparing the client CRC unique pattern with the generated CRC value from the host;

means for detecting the corrupted CRC error value generated by the host at the client that corresponds to the specific system error or status condition; and means for instructing the client to take specific corrective action based on the detected corrupted CRC error value.

20. The CRC checker system of claim 19 wherein the error condition comprises an error in the data stream.

21. The CRC checker system of claim 19 wherein the specific error or status condition comprises at least one member from the group consisting of identification of transmission link information, system status information and system error information.

22. The CRC checker system of claim 19 further comprising means for recording the corrupted CRC error value.

23. The CRC checker system of claim 19 further comprising means for detecting the specific system error or status condition.

24. The CRC checker system of claim 19, wherein the digital transmission link is a MDDI transmission link.

* * * * *